United States Patent
Lai et al.

(10) Patent No.: US 12,131,863 B2
(45) Date of Patent: Oct. 29, 2024

(54) INDUCTOR STRUCTURE AND MANUFACTURING METHOD FOR THE SAME

(71) Applicant: MACRONIX INTERNATIONAL CO., LTD., Hsinchu (TW)

(72) Inventors: Erh-Kun Lai, Taichung (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 798 days.

(21) Appl. No.: 17/234,891

(22) Filed: Apr. 20, 2021

(65) Prior Publication Data
US 2022/0336145 A1  Oct. 20, 2022

(51) Int. Cl.
- H01F 27/28   (2006.01)
- H01F 27/32   (2006.01)
- H01F 41/12   (2006.01)
- H01L 49/02   (2006.01)

(52) U.S. Cl.
CPC ....... *H01F 27/323* (2013.01); *H01F 27/2823* (2013.01); *H01F 41/12* (2013.01); *H01L 28/10* (2013.01)

(58) Field of Classification Search
CPC .................................................. H01F 27/2823
USPC .......................................................... 336/222
See application file for complete search history.

(56) References Cited

U.S. PATENT DOCUMENTS

| | | | |
|---|---|---|---|
| 9,165,937 B2 | 10/2015 | Yip et al. | |
| 10,784,192 B2 | 9/2020 | Davis et al. | |
| 2003/0013264 A1* | 1/2003 | Yeo | H01L 23/645 |
| | | | 438/381 |
| 2007/0254448 A1* | 11/2007 | Bhatt | H01L 28/10 |
| | | | 257/E21.022 |
| 2015/0371751 A1* | 12/2015 | Kim | H01L 28/10 |
| | | | 336/200 |

FOREIGN PATENT DOCUMENTS

| CN | 111162166 A | 5/2020 |
|---|---|---|
| TW | 201642446 A | 12/2016 |

* cited by examiner

*Primary Examiner* — Ronald Hinson
(74) *Attorney, Agent, or Firm* — McClure, Qualey & Rodack, LLP

(57) ABSTRACT

An inductor structure and a manufacturing method for the same are provided. The inductor structure includes conductive layers and conductive elements. The conductive layers overlap in a vertical direction. Each of the conductive elements is coupled between two conductive layers of the conductive layers.

15 Claims, 25 Drawing Sheets

Inductor Structure and Manufacturing Method for the Same

BACKGROUND

Technical Field

The disclosure relates to an inductor structure and a manufacturing method for the same.

Description of the Related Art

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices.

SUMMARY

The present disclosure relates to an inductor structure and a manufacturing method for the same. The inductor structure can have a small layout area.

According to an embodiment, an inductor structure is provided. The inductor structure comprises conductive layers and conductive elements. The conductive layers overlap in a vertical direction. Each of the conductive elements coupled between two conductive layers of the conductive layers.

According to another embodiment, a manufacturing method for an inductor structure is provided, which comprises the following steps. Conductive layers are formed. The conductive layers overlap in a vertical direction. Conductive elements are formed on the conductive layers. Each of the conductive elements is coupled between two conductive layers of the conductive layers.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
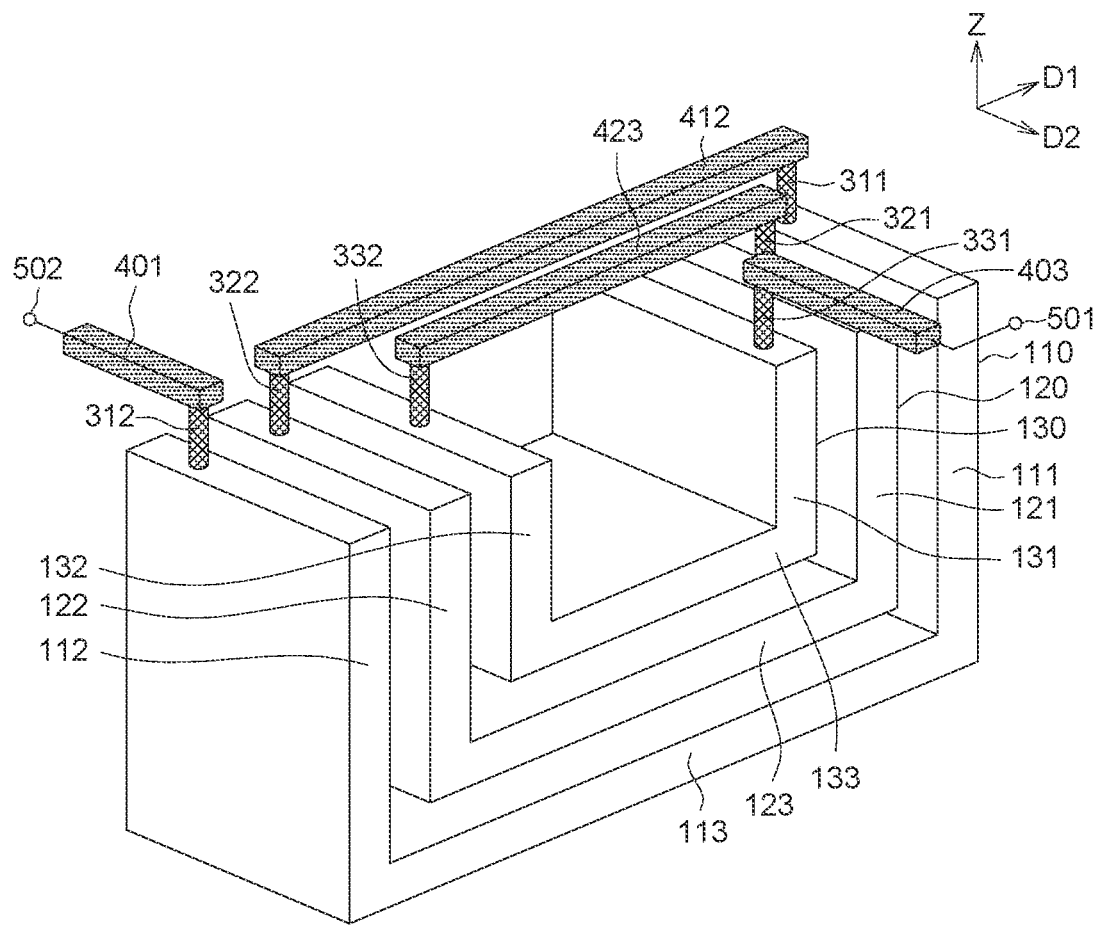
FIG. 1 illustrates a stereogram of an inductor structure in an embodiment.

FIG. 1 is referred to, which illustrates a stereogram of an inductor structure in an embodiment.

A conductive layer 100 may comprise a conductive layer 110, a conductive layer 120 and a conductive layer 130 separated from each other. The conductive layer 100 may have a U shape. The conductive layer 100 comprises a first conductive branch part 101, a second conductive branch part 102 and a conductive trunk part 103. The conductive layer 110 comprises a first conductive branch part 111, a second conductive branch part 112 and a conductive trunk part 113. The conductive trunk part 113 is coupled between the first conductive branch part 111 and the second conductive branch part 112. The conductive layer 120 comprises a first conductive branch part 121, a second conductive branch part 122 and a conductive trunk part 123. The conductive trunk part 123 is coupled between the first conductive branch part 121 and the second conductive branch part 122. The conductive layer 130 comprises a first conductive branch part 131, a second conductive branch part 132 and a conductive trunk part 133. The conductive trunk part 133 is coupled between the first conductive branch part 131 and the second conductive branch part 132.

The first conductive branch parts 101 (comprising the first conductive branch part 111, the first conductive branch part 121 and the first conductive branch part 131) and the second conductive branch parts 102 (comprising the second conductive branch part 112, the second conductive branch part 122 and the second conductive branch part 132) may be extended along a vertical direction Z, and may be separated from each other in a first horizontal direction D1. The conductive trunk parts 103 (comprising the conductive trunk part 113, the conductive trunk part 123, and the conductive trunk part 133) may be extended along the first horizontal direction D1, and may be separated from each other in the vertical direction Z. The first conductive branch part 111, the first conductive branch part 121, and the first conductive branch part 131 are adjacent to each other. The first conductive branch part 111, the first conductive branch part 121, and the first conductive branch part 131 are on the same one side of the conductive trunk parts 103. The second conductive branch part 112, the second conductive branch part 122, and the second conductive branch part 132 are adjacent to each other. The second conductive branch part 112, the second conductive branch part 122, and the second conductive branch part 132 are on the same opposing one side of the conductive trunk parts 103. The conductive trunk part 113, the conductive trunk part 123, and the conductive trunk part 133 are adjacent to each other. The conductive trunk part 113, the conductive trunk part 123, and the conductive trunk part 133 overlap with each other in the vertical direction Z. The first conductive branch parts 101 and the second conductive branch parts 102 overlap with each other in the first horizontal direction D1. The first conductive branch parts 101 and the second conductive branch parts 102 may not overlap with each other in the vertical direction Z. Upper conductive surfaces of the first conductive branch parts 101 and the second conductive branch parts 102 may be level with each other.

A conductive element 200 may comprise a conductive element 212, a conductive element 223, a conductive element 201 and a conductive element 203. The conductive element 212 may comprise a first conductive pillar 311, a second conductive pillar 322 and a conductive wire 412. The first conductive pillar 311 may be on the upper conductive surface of the first conductive branch part 111. The second conductive pillar 322 may be on the upper conductive surface of the second conductive branch part 122. The conductive wire 412 is coupled between the first conductive pillar 311 and the second conductive pillar 322. The conductive element 223 may comprise a first conductive pillar 321, a second conductive pillar 332 and a conductive wire 423. The first conductive pillar 321 may be on the upper conductive surface of the first conductive branch part 121. The second conductive pillar 332 may be on the upper conductive surface of the second conductive branch part 132. The conductive wire 423 is coupled between the first conductive pillar 321 and the second conductive pillar 332. The conductive element 201 may comprise a second conductive pillar 312 and a conductive wire 401. The second conductive pillar 312 may be on the upper conductive surface of the second conductive branch part 112. The conductive wire 401 may be on the second conductive pillar 312. The conductive element 203 may comprise a first conductive pillar 331 and a conductive wire 403. The first conductive pillar 331 may be on the upper conductive surface of the first conductive branch part 131. The conductive wire 403 may be on the first conductive pillar 331. Conductive pillars 300 (comprising the first conductive pillar 311, the first conductive pillar 321, the first conductive pillar 331, the second conductive pillar 312, the second conductive pillar 322 and the second conductive pillar 332) may have the same size in the vertical direction Z (i.e. height).

A coil inductor comprises the conductive layer 110, the conductive layer 120, the conductive layer 130, the conductive element 212 and the conductive element 223. The conductive layer 110, the conductive layer 120, and the conductive layer 130 are overlapping in the vertical direction Z, and therefore the coil inductor can occupy a small layout area. The conductive layer 110, the conductive layer 120, and the conductive layer 130 may be separated from each other by insulating layers (e.g. insulating layers 754 as shown in FIG. 11B and FIG. 11C). The conductive wire 403 may be coupled between a first signal terminal 501 and the first conductive pillar 331. The conductive wire 401 may be coupled between a second signal terminal 502 and the second conductive pillar 312. The first signal terminal 501 is one of a current input terminal and a current output terminal. The second signal terminal 502 is the other of the current input terminal and the current output terminal. A magnetic field along a second horizontal direction D2 may be induced by the coil inductor. In embodiments, the coil inductor is not limited to a structure of three coils. The coil inductor may have a structure of other coil quantities formed by the conductive layers 100 and the conductive elements 200 of other quantities, such as four, five, or more coils. The coil inductor may be referred to as 3D inductor.

Figure 2:
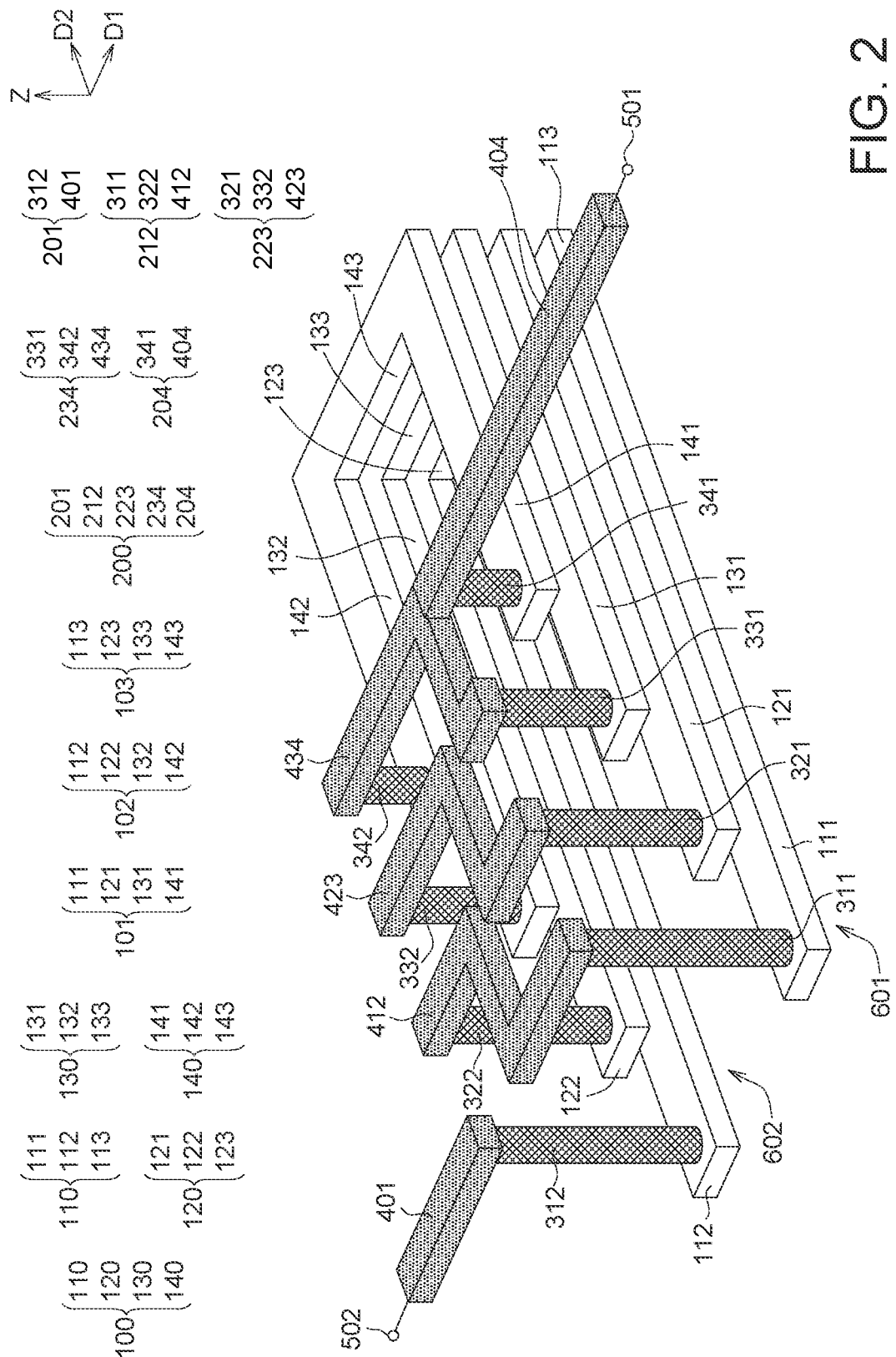
FIG. 2 illustrates a stereogram of an inductor structure in another embodiment.

FIG. 2 is referred to, which illustrates a stereogram of an inductor structure in another embodiment. The inductor structure in FIG. 2 is different from the inductor structure in FIG. 1 with the following description.

The conductive layer 100 may comprise the conductive layer 110, the conductive layer 120, the conductive layer 130 and a conductive layer 140 separated from each other and overlapped with each other in the vertical direction Z. The conductive layer 110, the conductive layer 120, the conductive layer 130 and the conductive layer 140 may be separated from each other by insulating layers (e.g. the insulating layers 754 as shown in FIG. 17B). The conductive layer 140 comprises a first conductive branch part 141, a second conductive branch part 142 and a conductive trunk part 143. The conductive trunk part 143 is coupled between the first conductive branch part 141 and the second conductive branch part 142.

The conductive trunk parts 103 (comprising the conductive trunk part 113, the conductive trunk part 123, the conductive trunk part 133 and the conductive trunk part 143) may be extended along the first horizontal direction D1. The conductive trunk part 113, the conductive trunk part 123, the conductive trunk part 133 and the conductive trunk part 143 may have a uniform size in the first horizontal direction D1. The first conductive branch parts 101 (comprising the first conductive branch part 111, the first conductive branch part 121, the first conductive branch part 131 and the first conductive branch part 141) and the second conductive branch parts 102 (comprising the second conductive branch part 112, the second conductive branch part 122, the second conductive branch part 132 and the second conductive branch part 142) may be extended along the second horizontal direction D2. The first horizontal direction D1 may be different from the second horizontal direction D2. For example, the first horizontal direction D1 may be perpendicular to the second horizontal direction D2.

The conductive element 200 may comprise the conductive element 212, the conductive element 223, the conductive element 201, a conductive element 234 and a conductive element 204. The conductive element 234 may comprise the first conductive pillar 331, a second conductive pillar 342 and a conductive wire 434. The conductive element 204 may comprise a conductive pillar 341 and a conductive wire 404. The conductive wire 404 is coupled between the conductive pillar 341 and the first signal terminal 501.

The coil inductor comprises the conductive layer 110, the conductive layer 120, the conductive layer 130, the conductive layer 140, the conductive element 212, the conductive element 223 and the conductive element 234.

A first stair structure 601 may comprise the first conductive branch part 111, the first conductive branch part 121, the first conductive branch part 131 and the first conductive branch part 141 arranged from a lower position to an upper position in order. The first conductive branch part 111, the first conductive branch part 121, the first conductive branch part 131 and the first conductive branch part 141 are overlapped with each other and are separated from each other in the vertical direction Z. A second stair structure 602 may comprise the second conductive branch part 112, the second conductive branch part 122, the second conductive branch part 132 and the second conductive branch part 142 arranged from a lower position to an upper position in order. The second conductive branch part 112, the second conductive branch part 122, the second conductive branch part 132 and the second conductive branch part 142 are overlapped with each other and are separated from each other in the vertical direction Z.

The first conductive branch part 111 and the second conductive branch part 112 may have a size in the second horizontal direction D2 larger than a size of the first conductive branch part 121 and the second conductive branch part 122 in the second horizontal direction D2. The size relations among the other conductive branch parts may be deduced by analogy.

The second conductive pillar 312 and the first conductive pillar 311 coupled on the conductive layer 110 may have a size in the vertical direction Z (i.e. height) larger than a size in the vertical direction Z of the first conductive pillar 321 and the second conductive pillar 322 coupled on the conductive layer 120. The size relations among the other conductive pillars may be deduced by analogy.

The coil inductor comprises the conductive layer 110, the conductive layer 120, the conductive layer 130, the conductive layer 140, the conductive element 212, the conductive element 223 and the conductive element 234. The conductive layer 110, the conductive layer 120, the conductive layer 130 and the conductive layer 140 are overlapping in the vertical direction Z, and therefore the coil inductor can occupy a small layout area. A magnetic field along the vertical direction Z may be induced by the coil inductor. In embodiments, the coil inductor is not limited to a structure of four coils. The coil inductor may have a structure of other coil quantities formed by the conductive layers 100 and the conductive elements 200 of other quantities, such as five, six or more coils. The coil inductor may be referred to as 3D inductor.

FIG. 3 to FIG. 11C illustrate a manufacturing method for an inductor structure in an embodiment.

Figure 3:
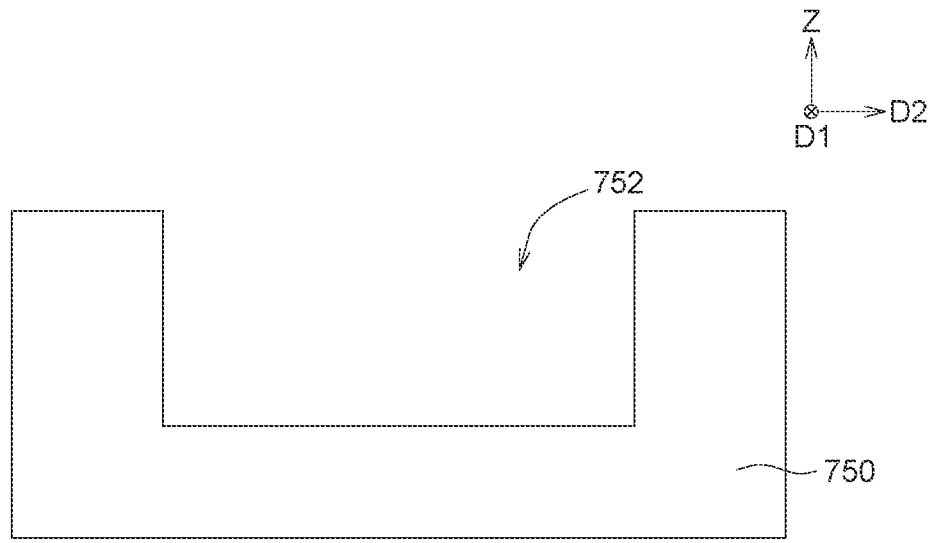
FIG. 3 to FIG. 11C illustrate a manufacturing method for an inductor structure in an embodiment.

Referring to FIG. 3, a substrate 750 is provided. The substrate 750 may comprise an oxide such as silicon oxide, or other suitable dielectric materials. The substrate 750 may be patterned to define a recess 752. The patterning step may be performed by a reactive-ion etching (RIE) method or other suitable etching methods.

Figure 4:
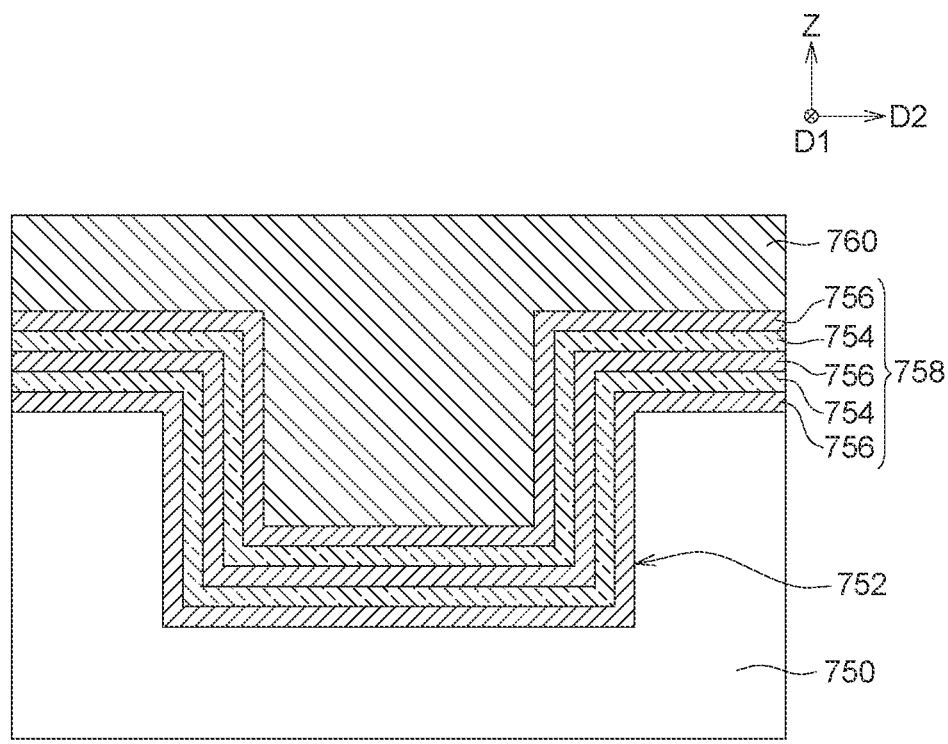

Referring to FIG. 4, the insulating layers 754 and material layers 756 are stacked alternately to form a stacked structure 758 in the recess 752 and on an upper surface of the substrate 750. The material layers 756 are separated from each other by the insulating layers 754. A dielectric element 760 is formed on the stacked structure 758. The material layers 756 may have a material different from materials of the insulating layers 754 and the dielectric element 760. The insulating layers 754 may comprise an oxide such as silicon oxide, or other suitable dielectric materials. The material layers 756 may comprise a nitride such as silicon nitride, or other suitable dielectric materials. The dielectric element 760 may comprise an oxide such as silicon oxide, or other suitable dielectric materials. Portions of the stacked structure 758 and the dielectric element 760 on the upper surface of the substrate 750 may be removed by a chemical mechanical polishing or other etching methods to obtain a semiconductor structure as shown in FIG. 5A and FIG. 5B.

Figure 5A:
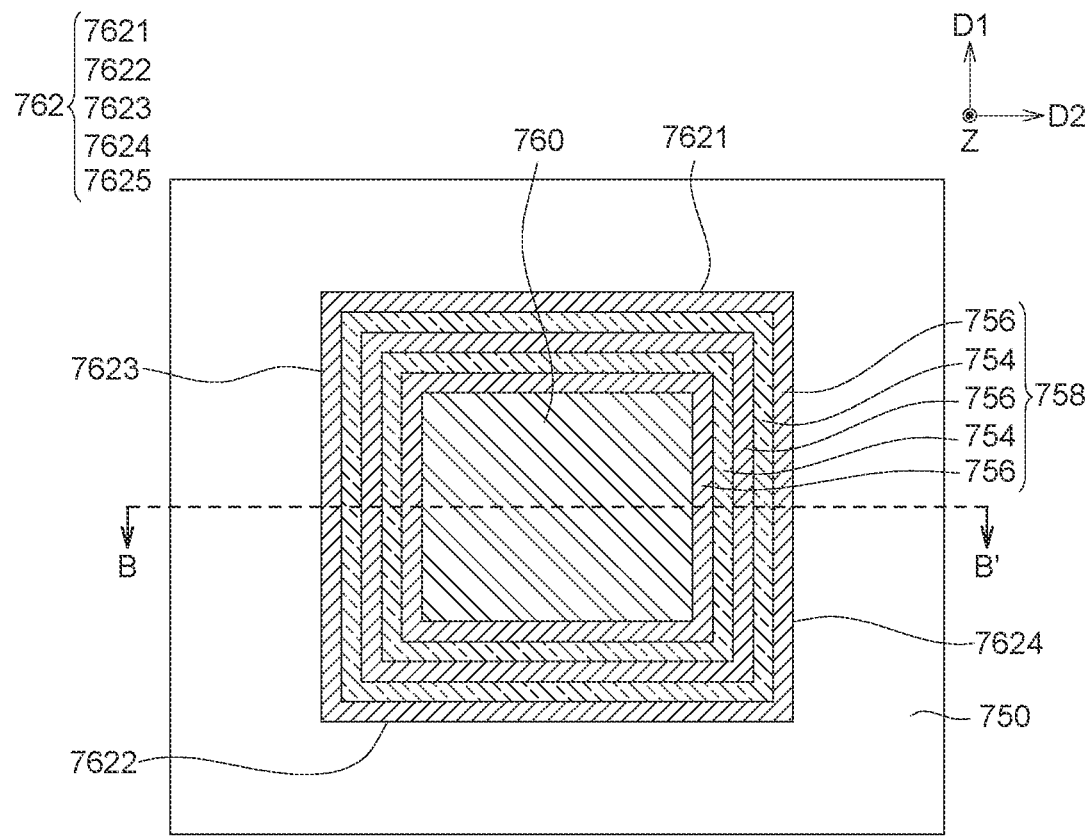
Figure 5B:
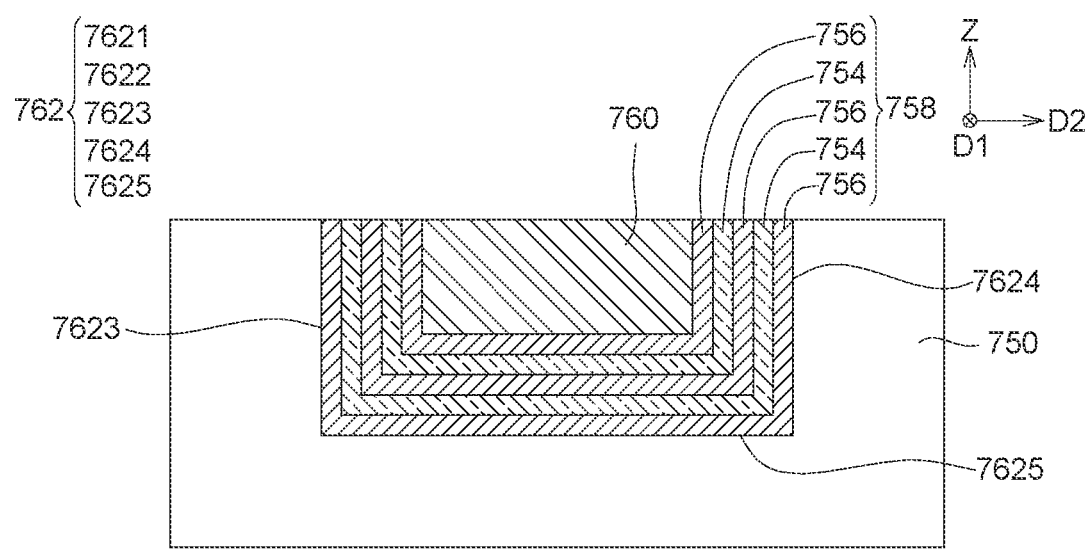
Figure 6A:
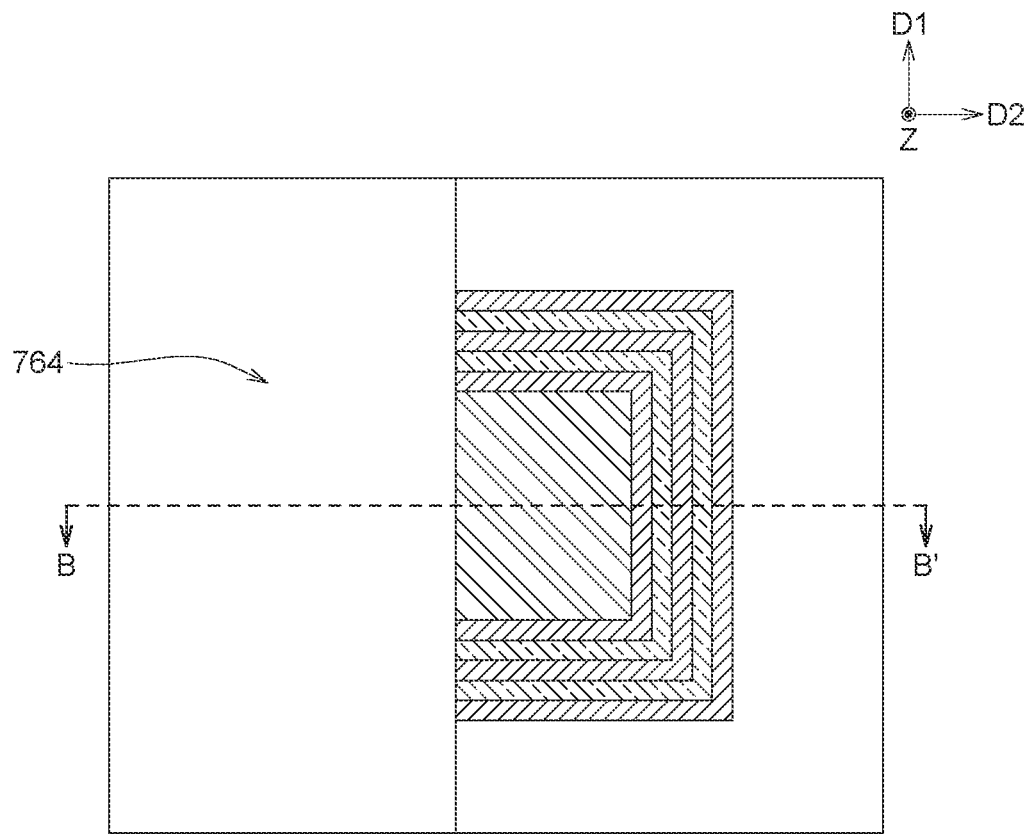
Figure 6B:
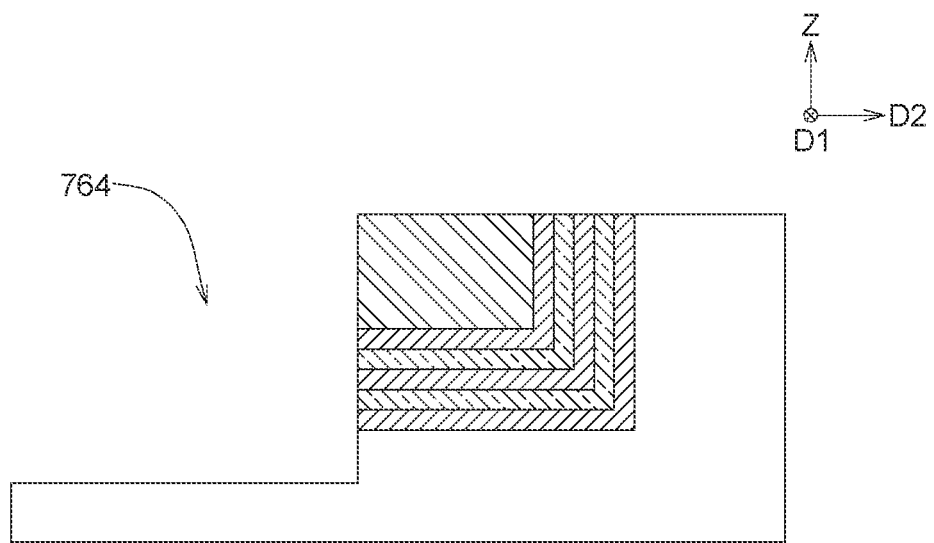

FIG. 5A and FIG. 5B are referred to. FIG. 5A is a top view of a semiconductor structure. FIG. 5B is a cross-section view of the semiconductor structure along a BB' line in FIG. 5A. The insulating layers 754 and the material layers 756 have a cup shape. A cup shape structure 762 may comprise a first wall part 7621, a second wall part 7622, a third wall part 7623, a fourth wall part 7624 and a bottom part 7625. The first wall part 7621 is opposing to the second wall part 7622. The third wall part 7623 is opposing to the fourth wall part 7624. The third wall part 7623 and the fourth wall part 7624 are between the first wall part 7621 and the second wall part 7622. The first wall part 7621, the second wall part 7622, the third wall part 7623 and the fourth wall part 7624 are extended upward along the vertical direction Z from the bottom part 7625. Each of the first wall part 7621, the second wall part 7622, the third wall part 7623, the fourth wall part 7624 and the bottom part 7625 comprises the stacked structure 758. A patterning step may be performed to the semiconductor structure to remove the third wall part 7623 and a portion of the substrate 750. The patterning step may also remove portions of the first wall part 7621, the second wall part 7622, the bottom part 7625 and the dielectric element 760 adjacent to the third wall part 7623. By the patterning step, a semiconductor structure having a first trench 764 as shown in FIG. 6A and FIG. 6B may be formed. FIG. 6A is a top view of the semiconductor structure. FIG. 6B is a cross-section view of the semiconductor structure along a BB' line in FIG. 6A. The patterning step may be performed by a reactive-ion etching method or other suitable etching methods.

Figure 7A:
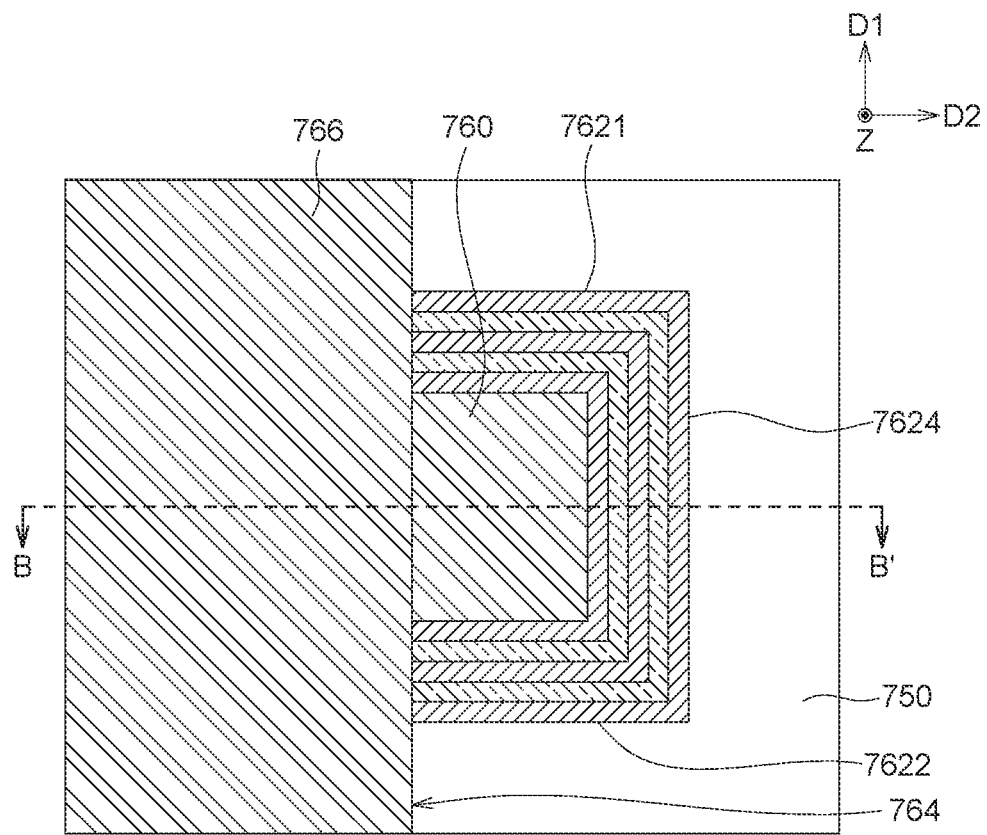
Figure 7B:
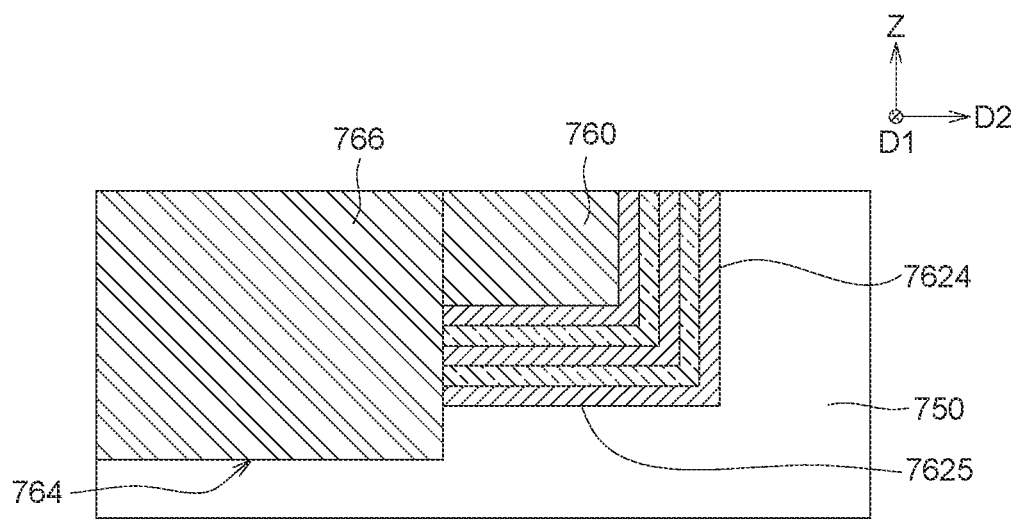
Figure 8A:
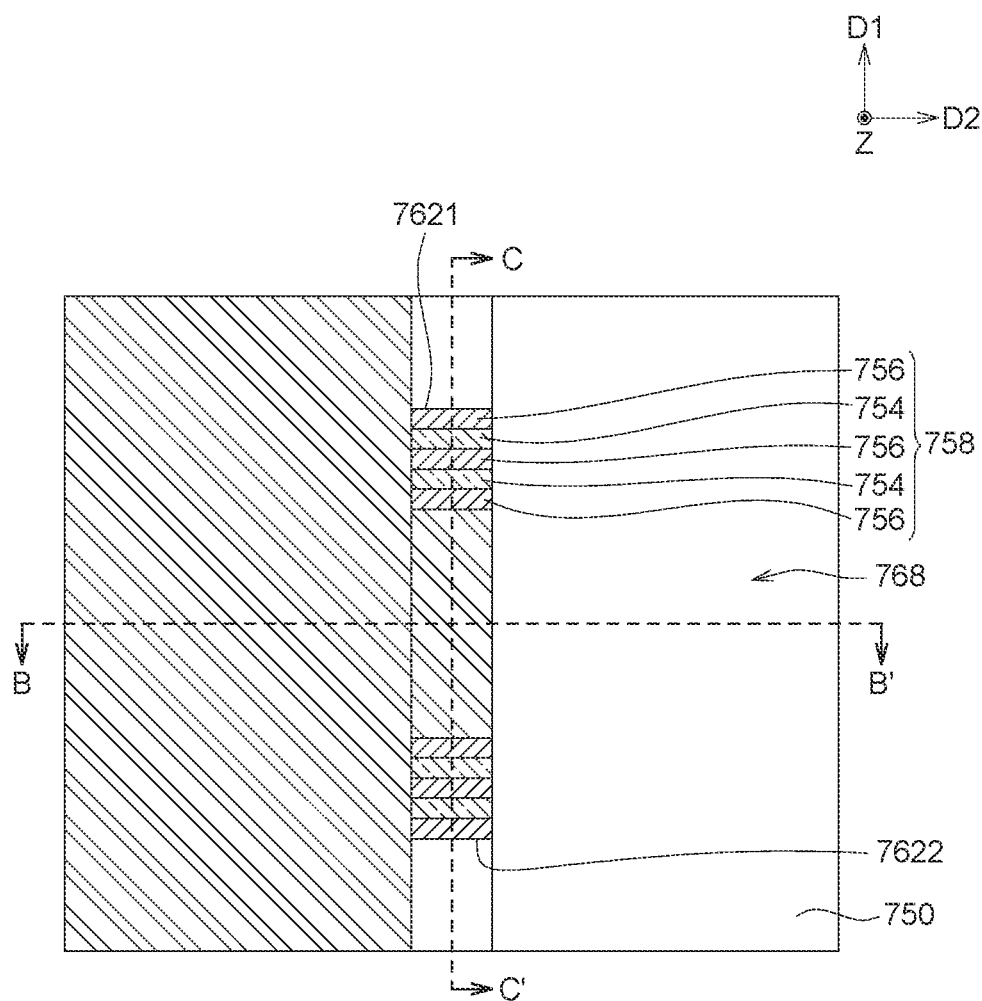
Figure 8B:
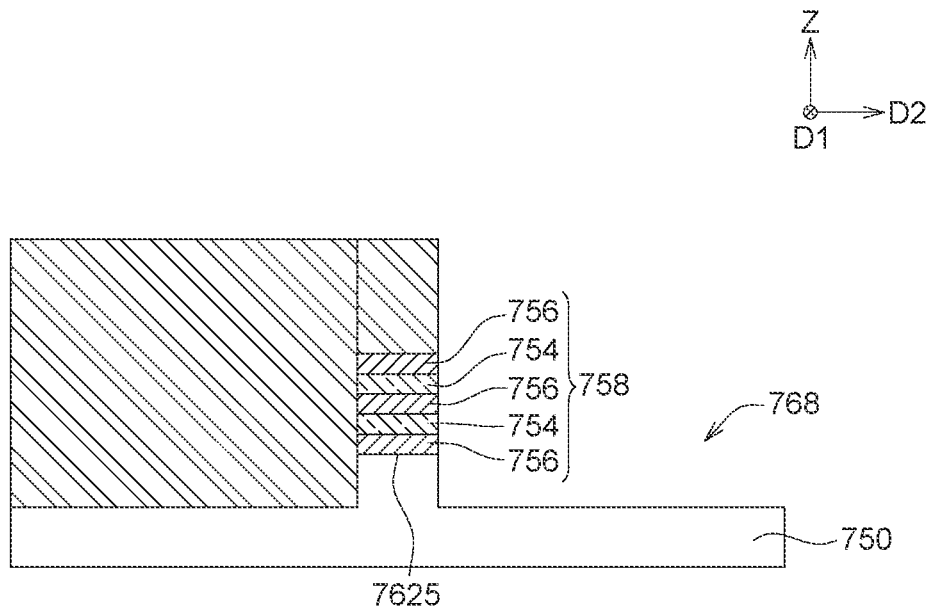

FIG. 7A and FIG. 7B are referred to. FIG. 7A is a top view of a semiconductor structure. FIG. 7B is a cross-section view of the semiconductor structure along a BB' line in FIG. 7A. An insulating element 766 is formed in the first trench 764. The insulating element 766 may comprise an oxide such as silicon oxide, or other suitable dielectric materials. A chemical mechanical polishing step may be performed to flatten the semiconductor structure. A patterning step may be performed to the semiconductor structure to remove the fourth wall part 7624 and a portion of the substrate 750. The patterning step may also remove portions of the first wall part 7621, the second wall part 7622, the bottom part 7625 and the dielectric element 760 adjacent to the fourth wall part 7624. By the patterning step, a semiconductor structure having a second trench 768 as shown in FIG. 8A and FIG. 8B may be formed. The patterning step may be performed by a reactive-ion etching method or other suitable etching methods.

Figure 8C:
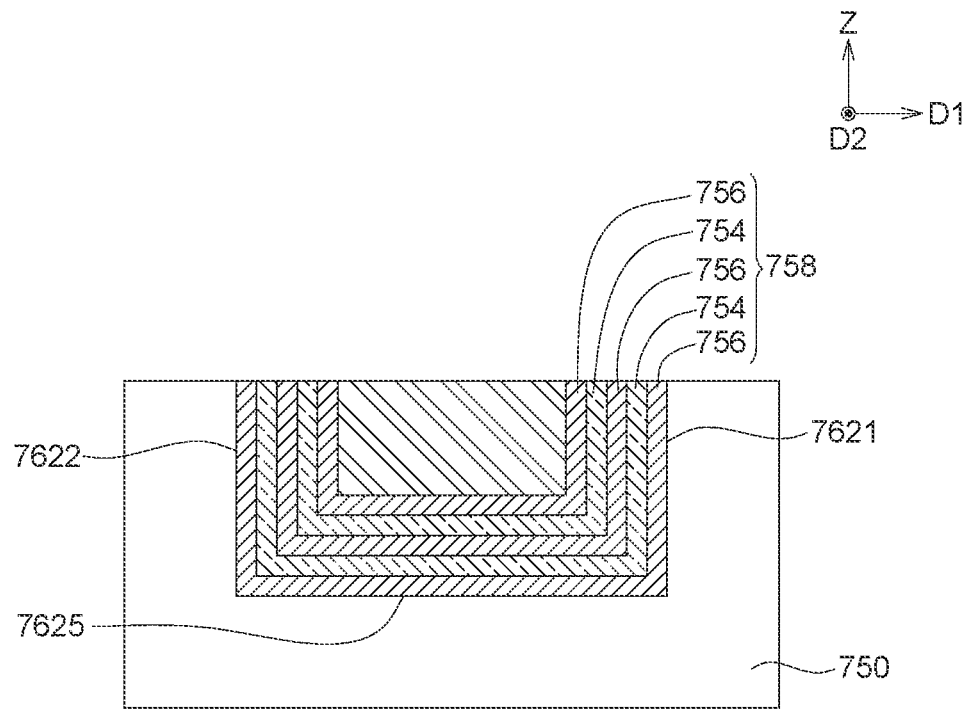
Figure 9A:
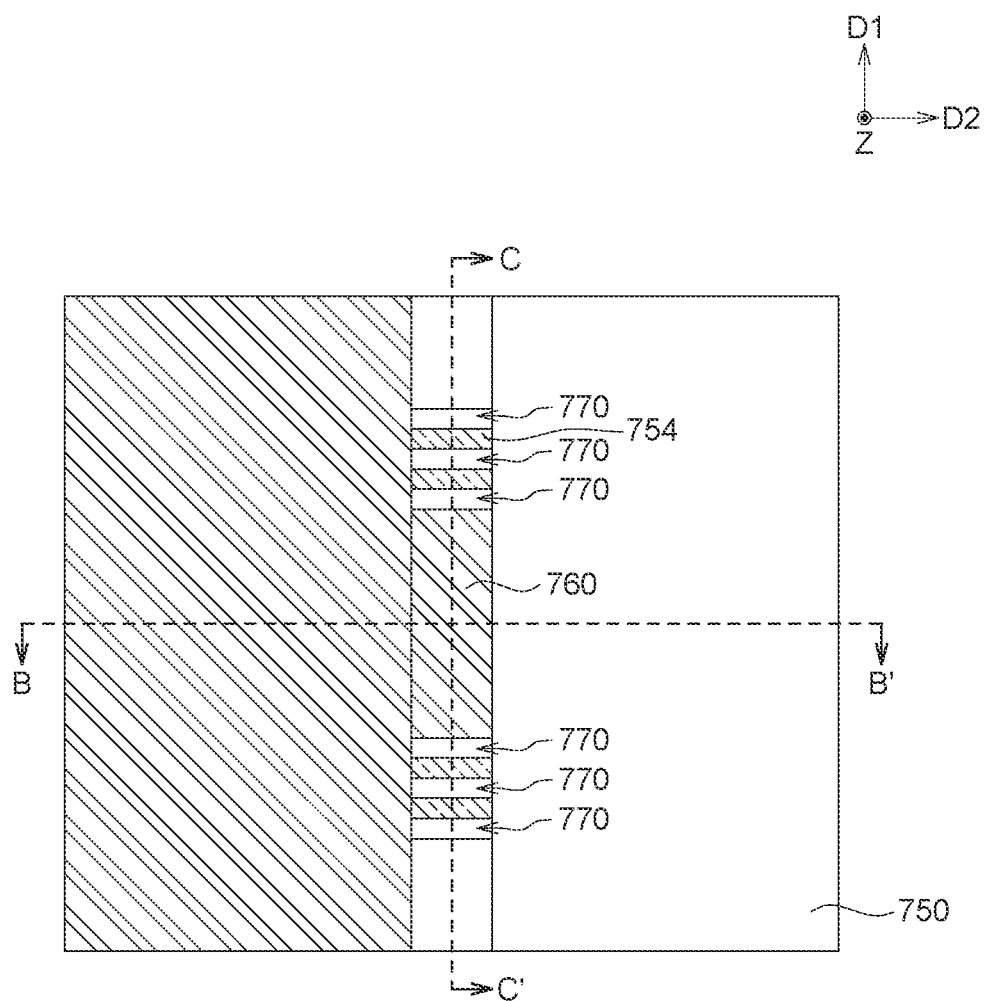
Figure 9B:
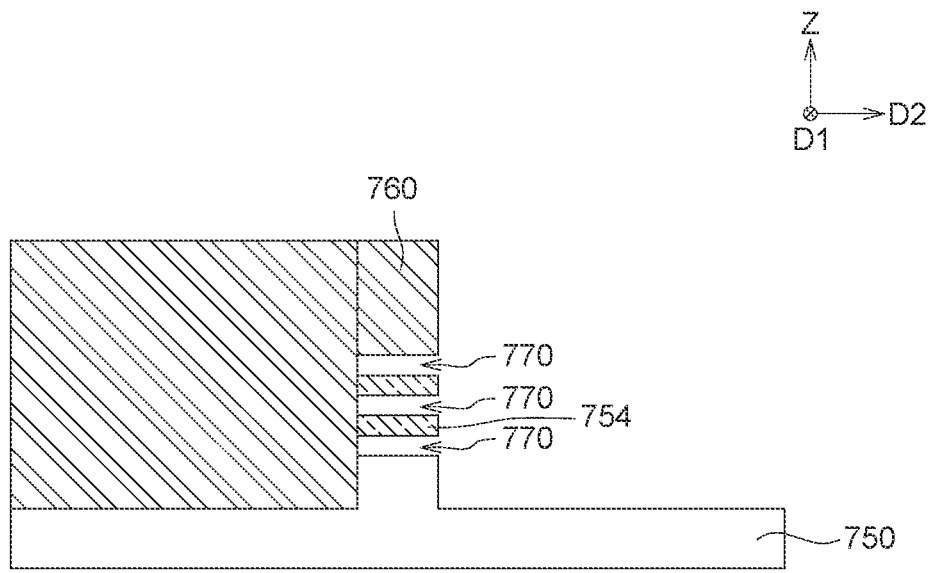
Figure 9C:
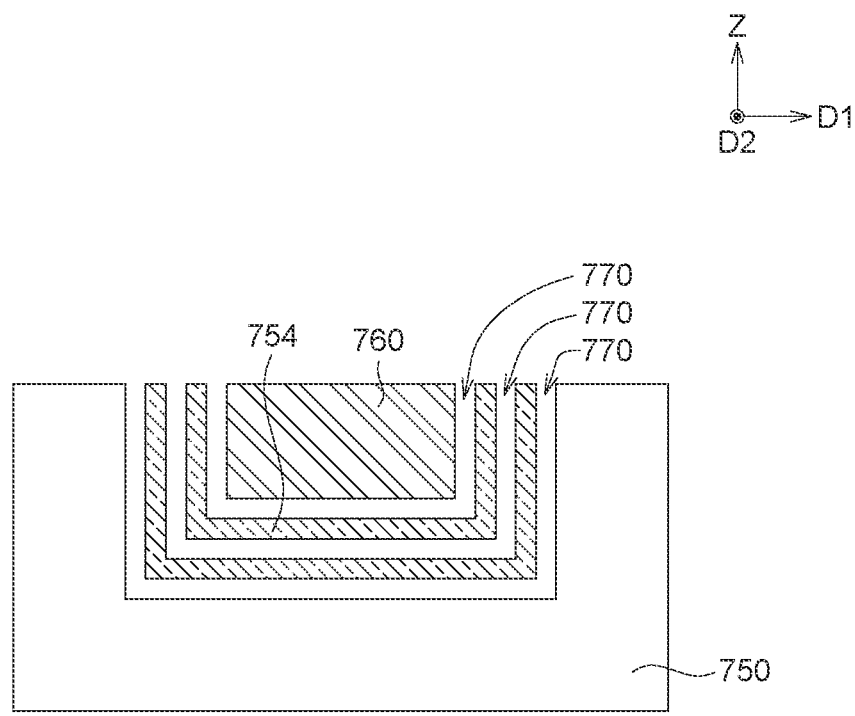

FIG. 8A to FIG. 8C are referred to. FIG. 8A is a top view of the semiconductor structure. FIG. 8B is a cross-section view of the semiconductor structure along a BB' line in FIG. 8A. FIG. 8C is a cross-section view of the semiconductor structure along a CC' line in FIG. 8A. The insulating layers 754 and the material layers 756 of the stacked structure 758 have a U shape. A selective etching method may be used to remove the material layers 756 to form slits 770 defined between the substrate 750, the insulating layers 754 and the dielectric element 760 as shown in FIG. 9A to FIG. 9C. FIG. 9A is a top view of the semiconductor structure. FIG. 9B is a cross-section view of the semiconductor structure along a BB' line in FIG. 9A. FIG. 9C is a cross-section view of the semiconductor structure along a CC' line in FIG. 9A.

Figure 10A:
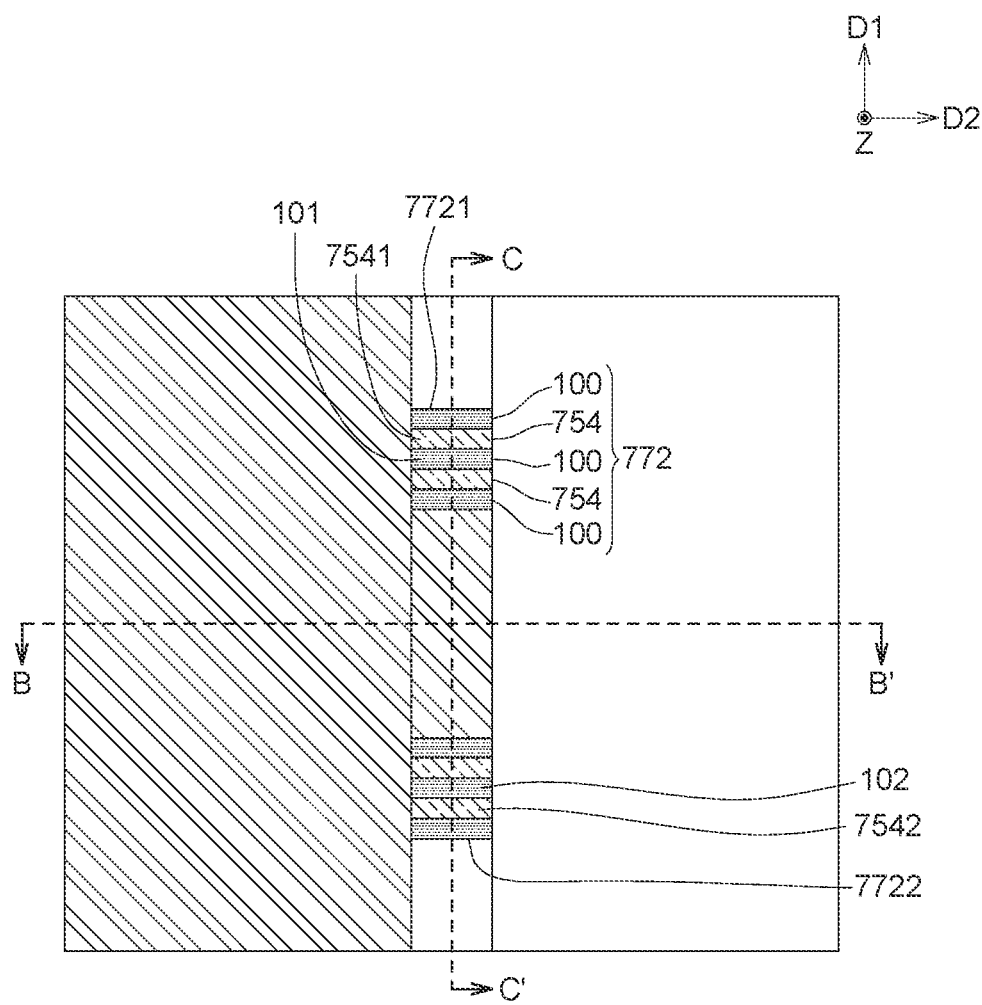
Figure 10B:
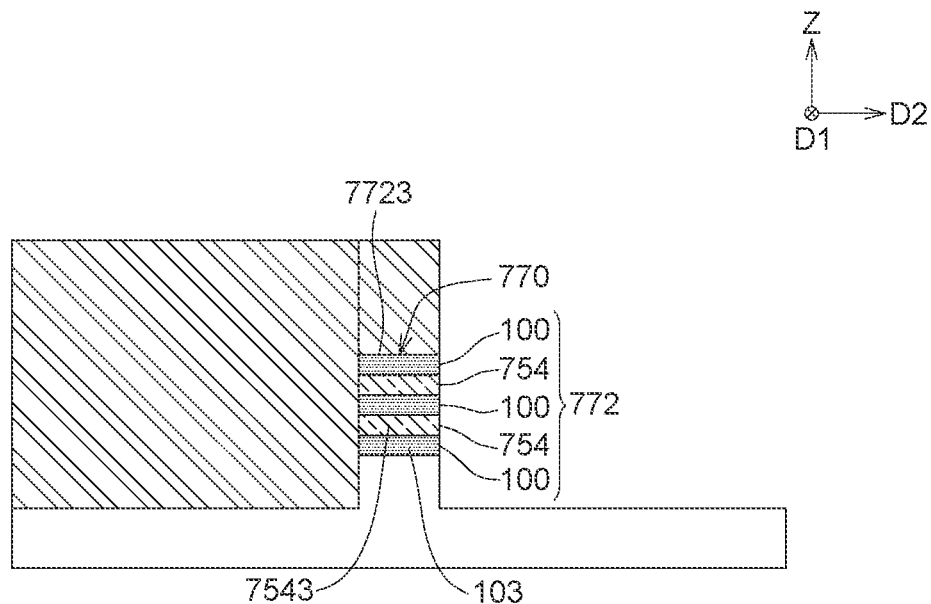
Figure 10C:
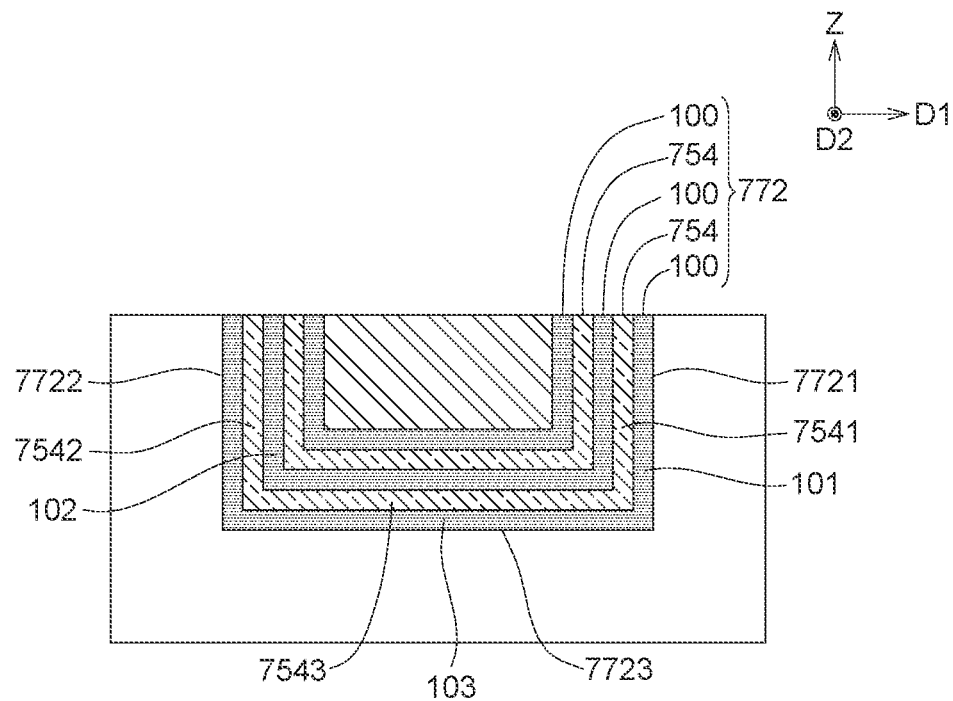

FIG. 10A to FIG. 10C are referred to. FIG. 10A is a top view of a semiconductor structure. FIG. 10B is a cross-section view of the semiconductor structure along a BB' line in FIG. 10A. FIG. 10C is a cross-section view of the semiconductor structure along a CC' line in FIG. 10A. The conductive layers 100 may be formed on a surface of the semiconductor structure. The conductive layers 100 may comprise a TaN film used as a barrier layer and a Cu film formed on the TaN film. The Cu film may comprise a Cu seed film. The present disclosure is not limited thereto. The conductive layers 100 may comprise other metal or conductive materials formed by a deposition process or a plating process. An etching back step may be performed to the conductive layers 100, which remains the conductive layers 100 in the slits 770. A stacked structure 772 comprises the conductive layers 100 and the insulating layers 754 stacked alternately. The conductive layers 100 are separated from each other by the insulating layers 754. The insulating layers 754 and the conductive layers 100 of the stacked structure 772 have a U shape. The stacked structure 772 comprises a first stacked branch part 7721, a second stacked branch part 7722 and a stacked trunk part 7723. The first stacked branch part 7721 (or stacked wall part) comprises first insulating branch parts 7541 (or insulating wall parts) of the insulating layers 754 and the first conductive branch parts 101 (or conductive wall parts) of the conductive layers 100. The second stacked branch part 7722 comprises second insulating branch parts 7542 of the insulating layers 754 and the second conductive branch parts 102 of the conductive layers 100. The stacked trunk part 7723 (or stacked bottom part) comprises insulating trunk parts 7543 (or insulating bottom parts) of the insulating layers 754 and the conductive trunk parts 103 (or conductive bottom parts) of the conductive layers 100. The insulating trunk parts 7543 and the conductive trunk parts 103 overlap in the vertical direction Z. The first insulating branch parts 7541, the second insulating branch parts 7542, the first conductive branch parts 101 and the second conductive branch parts 102 overlap in the first horizontal direction D1.

Figure 11A:
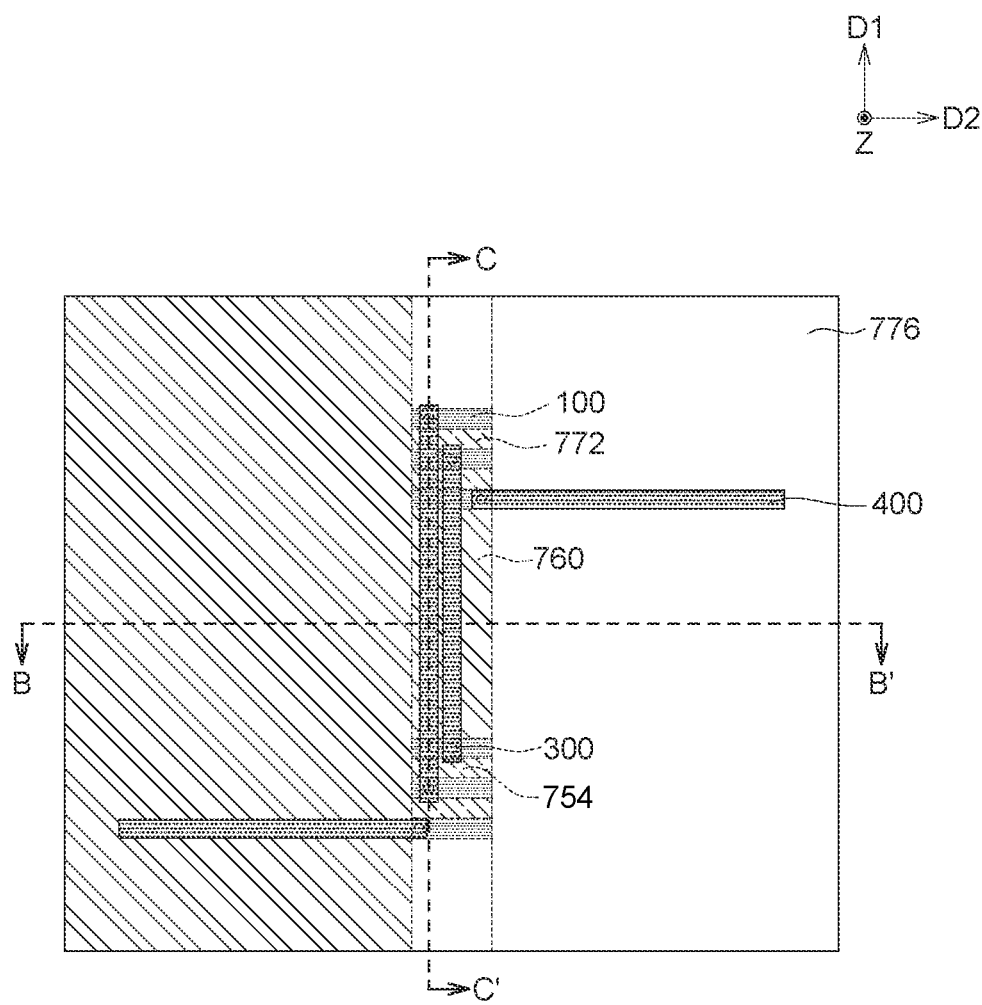
Figure 11B:
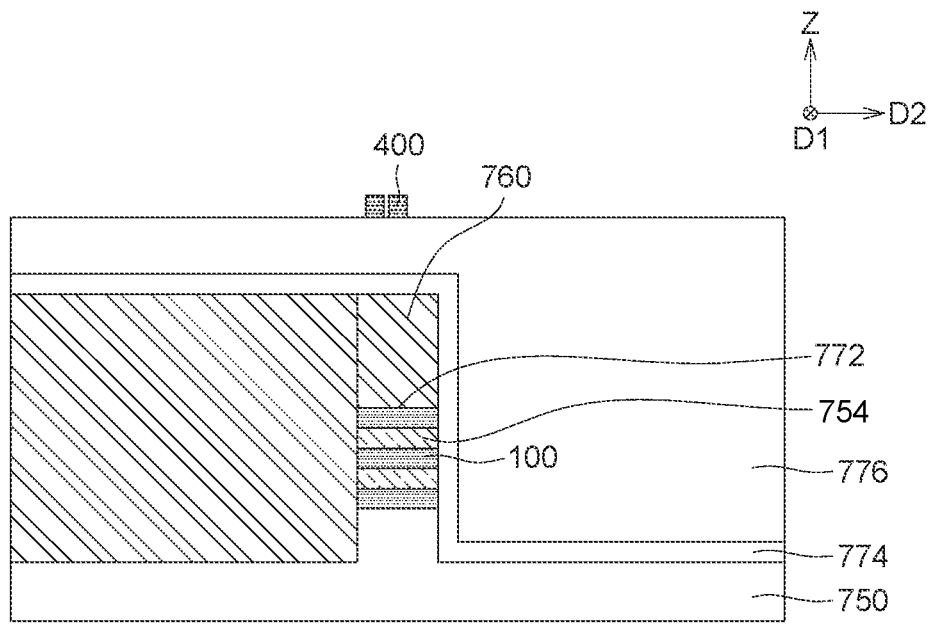
Figure 11C:
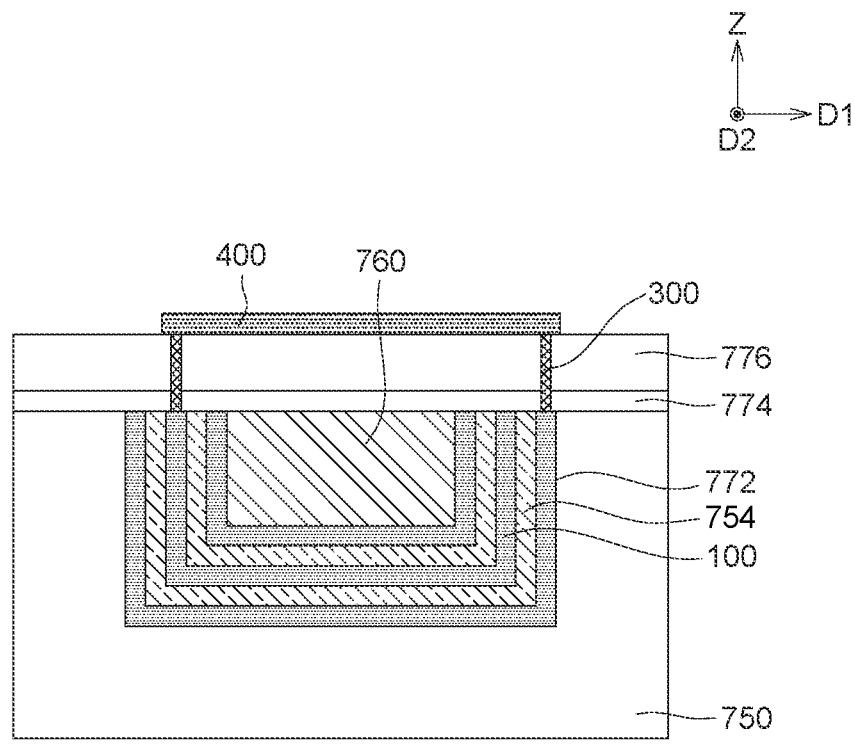

FIG. 11A to FIG. 11C are referred to. FIG. 11A is a top view of an inductor structure. FIG. 11B is a cross-section view of the inductor structure along a BB' line in FIG. 11A. FIG. 11C is a cross-section view of the inductor structure along a CC' line in FIG. 11A. A dielectric film 774 is formed on the substrate 750, the stacked structure 772 and the dielectric element 760. In an embodiment, the dielectric film 774 may be functioned as a barrier layer for avoiding copper containment diffusion from the conductive layers 100. A dielectric film 776 is formed on the dielectric film 774. The conductive pillars 300 passing through the dielectric film 776 and the dielectric film 774 are formed. The conductive pillars 300 are coupled on the conductive layers 100. Conductive wires 400 are formed on the dielectric film 776. The conductive wires 400 are coupled on the conductive pillars 300. The inductor structure comprises the coil inductor as shown in FIG. 1. In embodiments, the coil inductor may be used to reduce magnetic field impact to an active device such as a CMOS formed below the substrate 750.

FIG. 12 to FIG. 17B illustrate a manufacturing method for an inductor structure in another embodiment.

Figure 12:
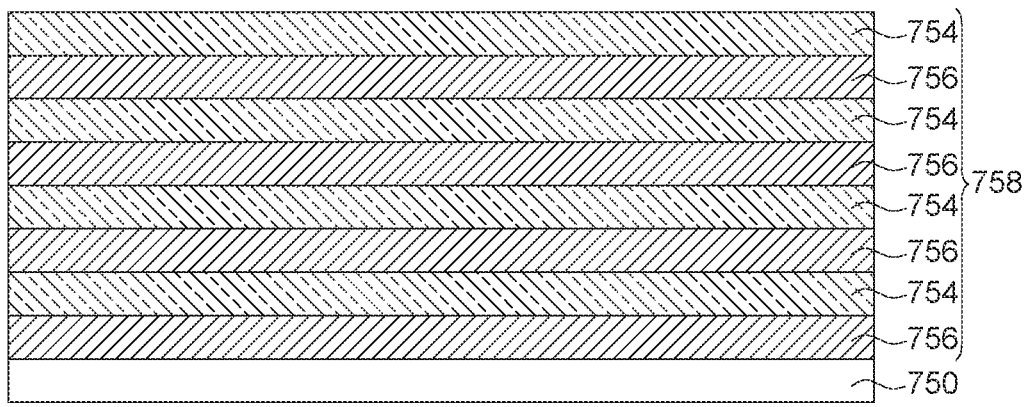
FIG. 12 to FIG. 17B illustrate a manufacturing method for an inductor structure in another embodiment.

Referring to FIG. 12, the insulating layers 754 and the material layers 756 are stacked alternately to form the stacked structure 758 on the upper surface of the substrate 750. The material layers 756 are separated from each other by the insulating layers 754.

Figure 13A:
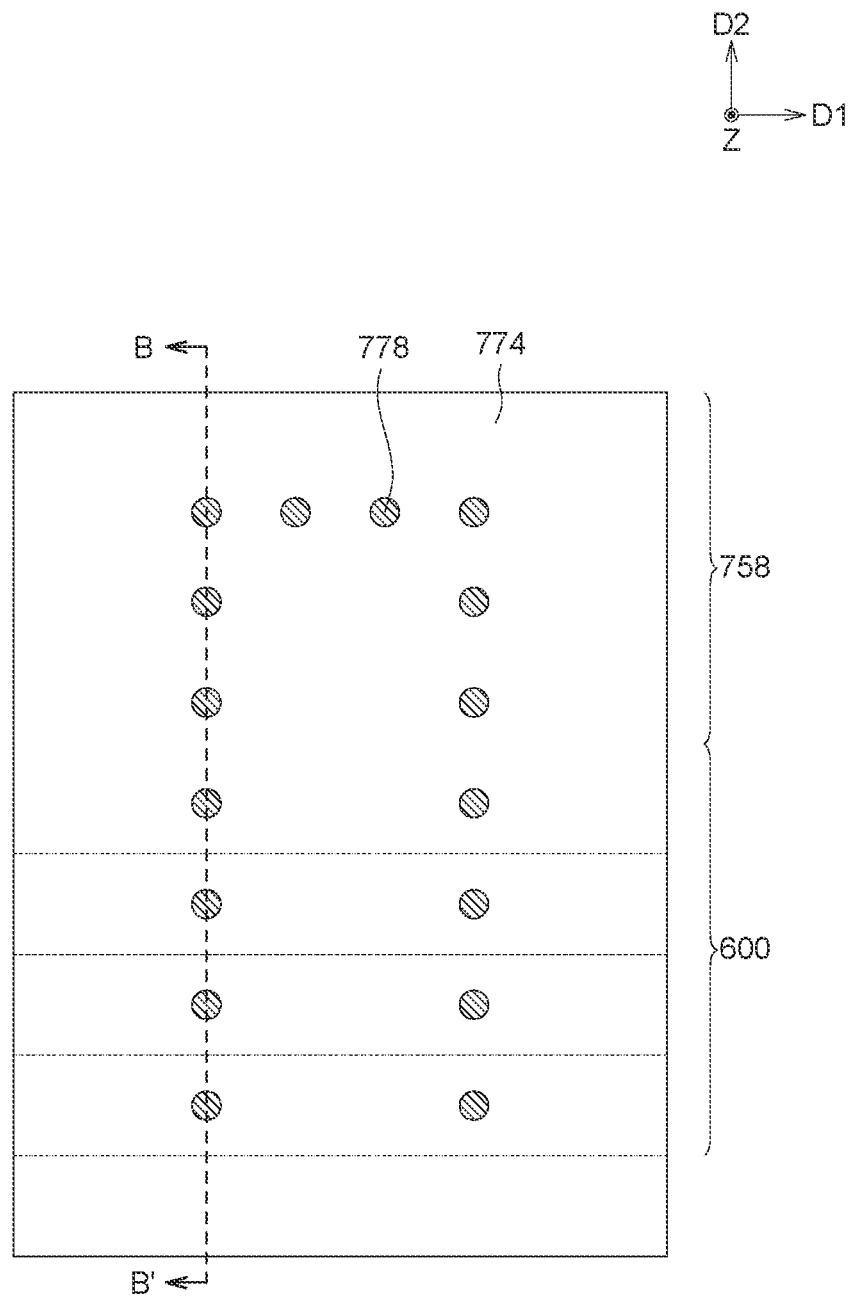
Figure 13B:
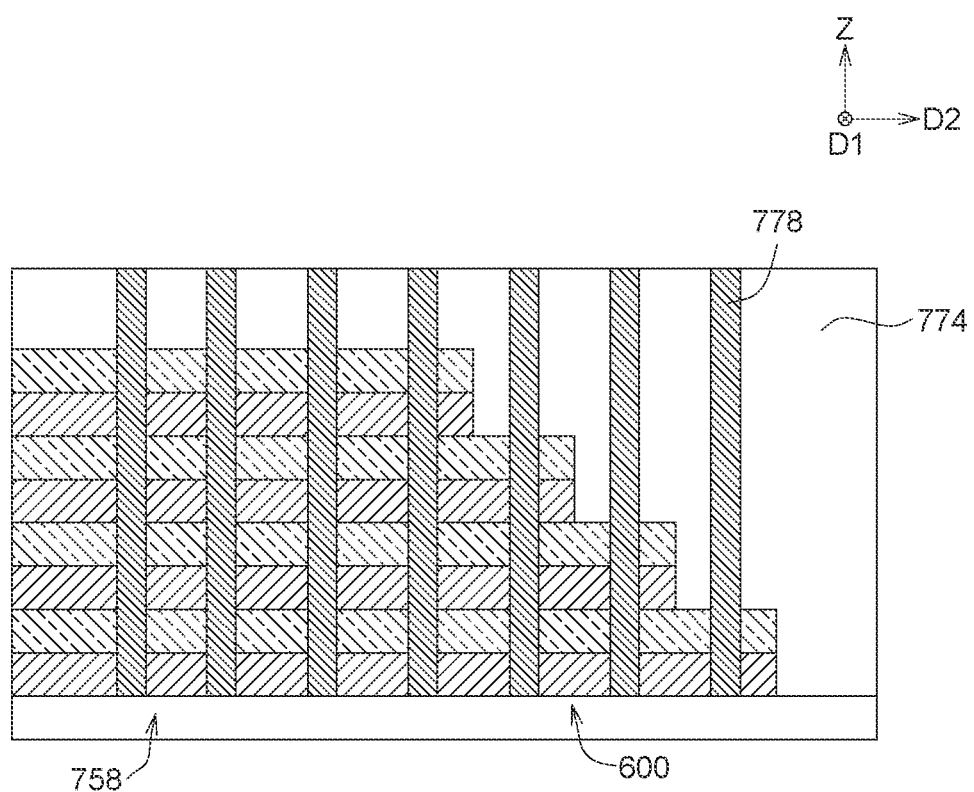

FIG. 13A and FIG. 13B are referred to. FIG. 13A is a top view of a semiconductor structure. FIG. 13B is a cross-section view of the semiconductor structure along a BB' line in FIG. 13A. A pattering step may be performed to the stacked structure 758 to form a stair structure 600. The dielectric film 774 is formed on the stacked structure 758 and the stair structure 600. The dielectric film 774 may comprise an oxide such as silicon oxide, or other suitable dielectric materials. Insulating pillars 778 passing through the stacked structure 758, the stair structure 600 and the dielectric film 774 are formed. The insulating pillars 778 may comprise an oxide such as silicon oxide, or other suitable dielectric materials. A patterning step may be performed to obtain a semiconductor structure as shown in FIG. 14A to FIG. 14C.

Figure 14A:
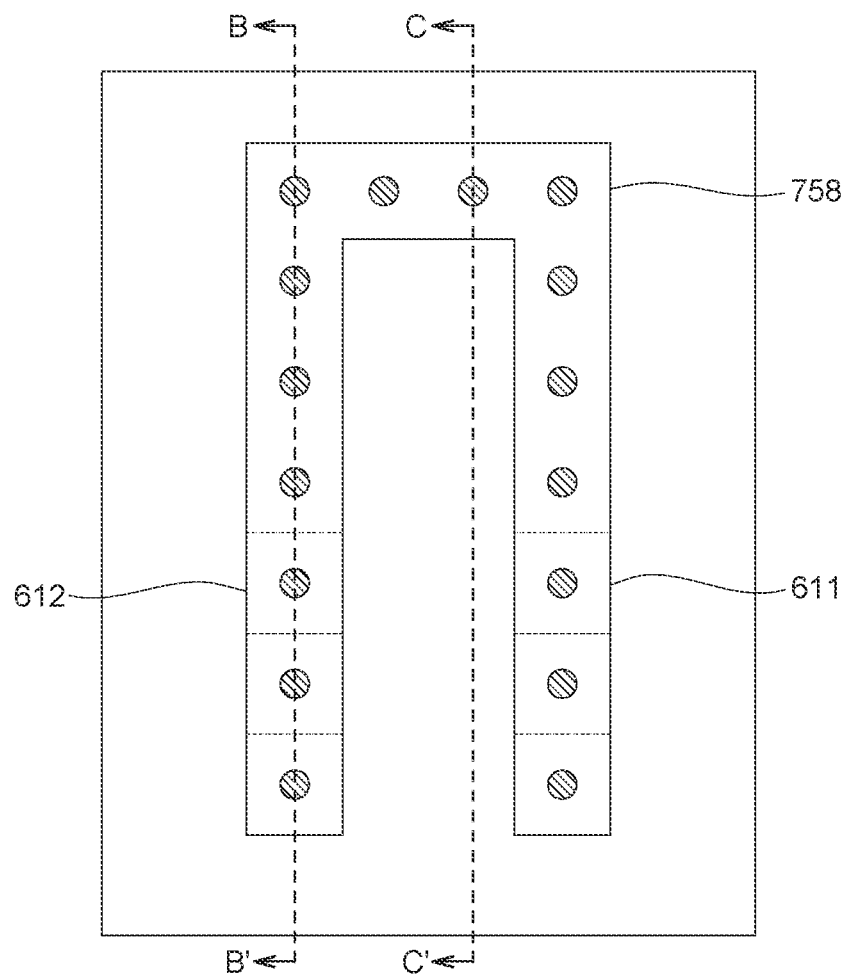
Figure 14B:
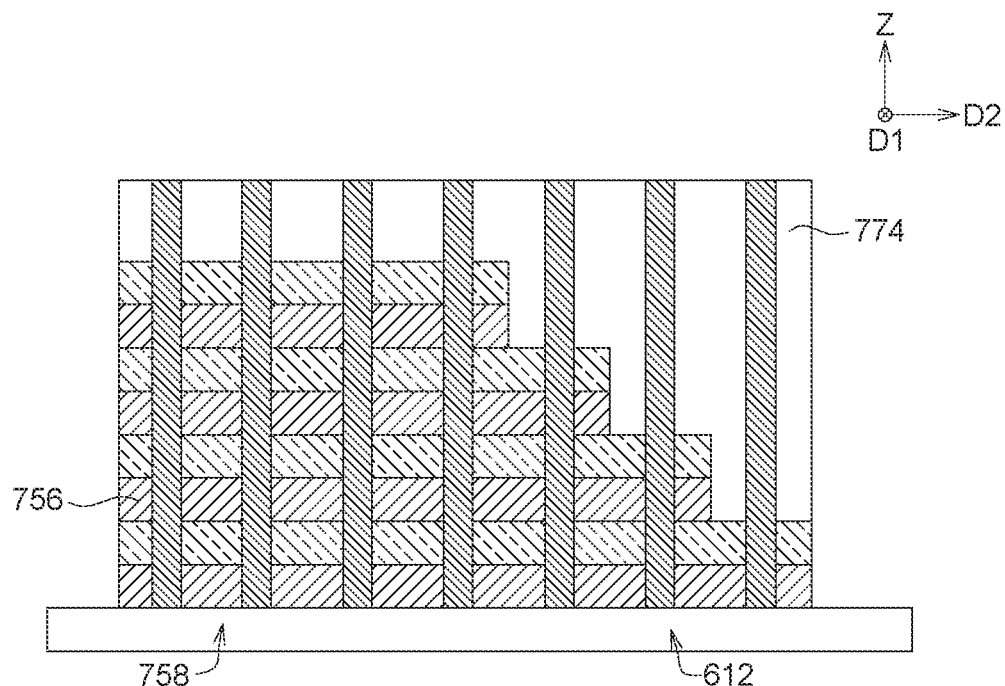
Figure 14C:
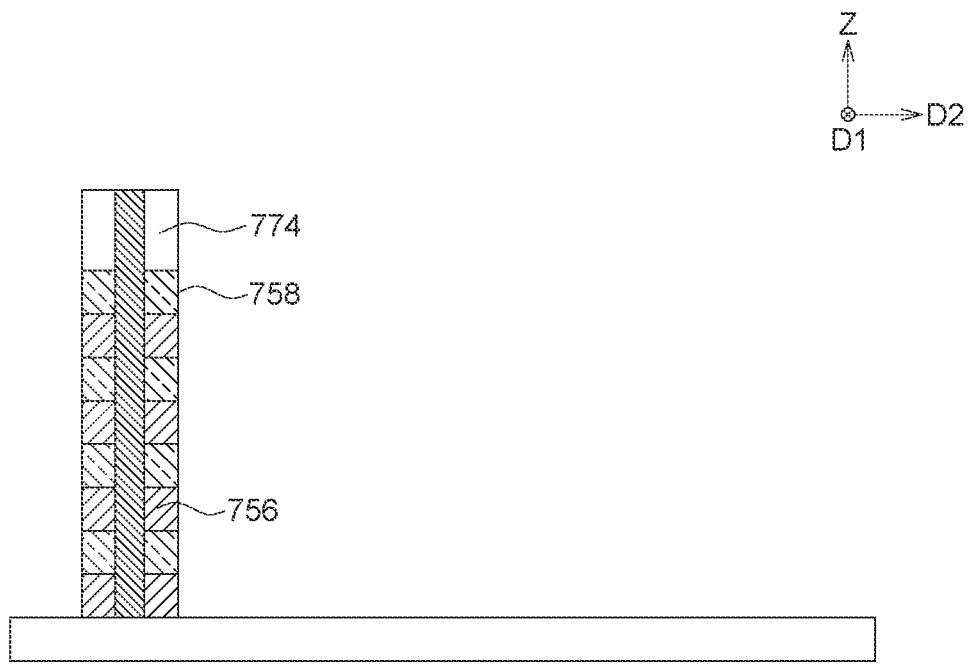
Figure 15A:
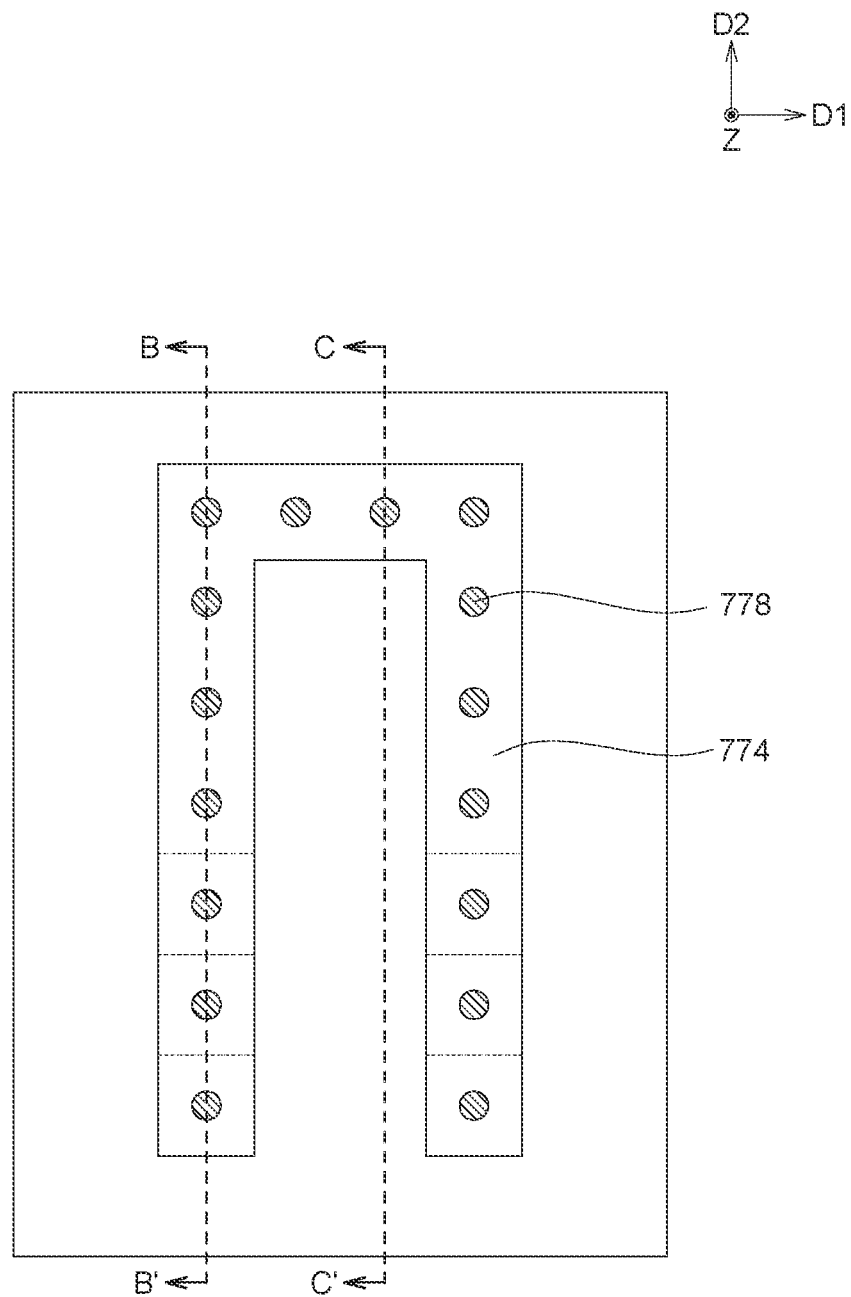
Figure 15B:
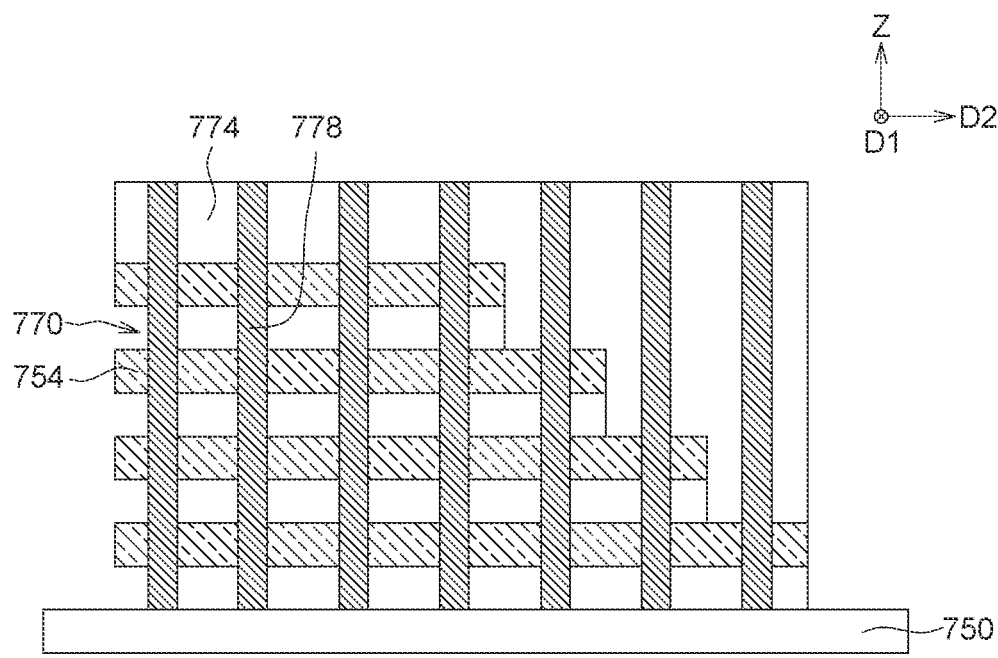
Figure 15C:
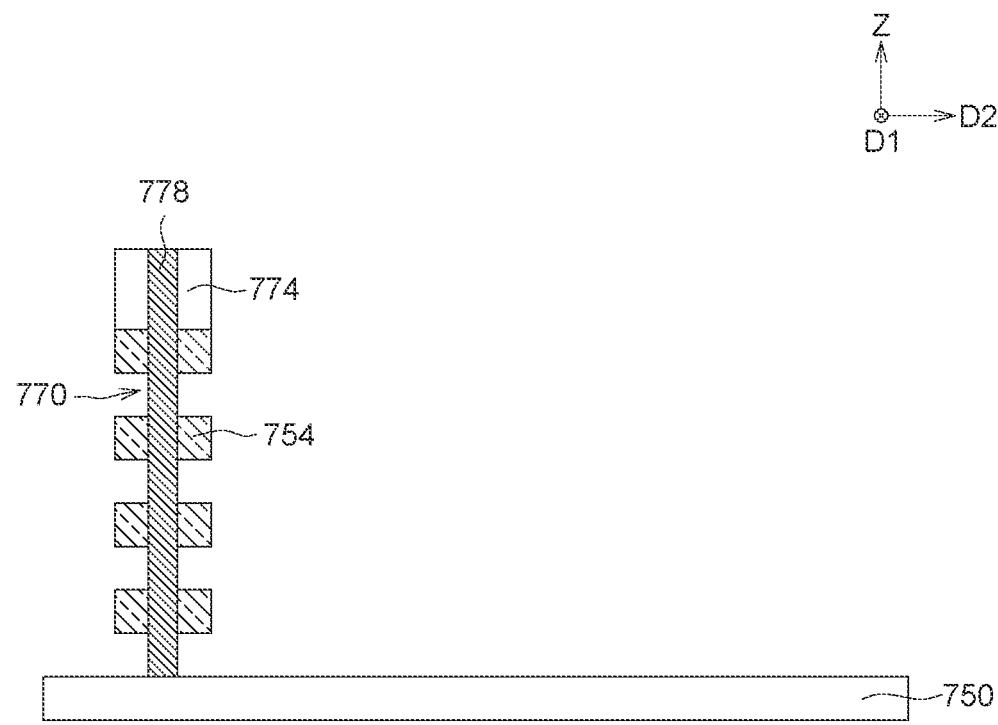

FIG. 14A to FIG. 14C are referred to. FIG. 14A is a top view of the semiconductor structure. FIG. 14B is a cross-section view of the semiconductor structure along a BB' line in FIG. 14A. FIG. 14C is a cross-section view of the semiconductor structure along a CC' line in FIG. 14A. A U shape structure 780 comprises the stacked structure 758, a first stair structure 611, a second stair structure 612 and the dielectric film 774. A selective etching method may be used to remove the material layers 756 to form the slits 770 defined between the substrate 750, the insulating layers 754 and the dielectric film 774 as shown in FIG. 15A to FIG. 15C. In an embodiment, the material layer 756 may comprise silicon nitride, and may be removed by a $H_3PO_4$ solution. The present disclosure is not limited thereto. The material layer 756 may be used by other selective etching methods, such as a dry etching method.

FIG. 15A to FIG. 15C are referred to. FIG. 15A is a top view of the semiconductor structure. FIG. 15B is a cross-section view of the semiconductor structure along a BB' line in FIG. 15A. FIG. 15C is a cross-section view of the semiconductor structure along a CC' line in FIG. 15A. Sidewall surfaces of the insulating pillars 778 are exposed by the slits 770.

Figure 16A:
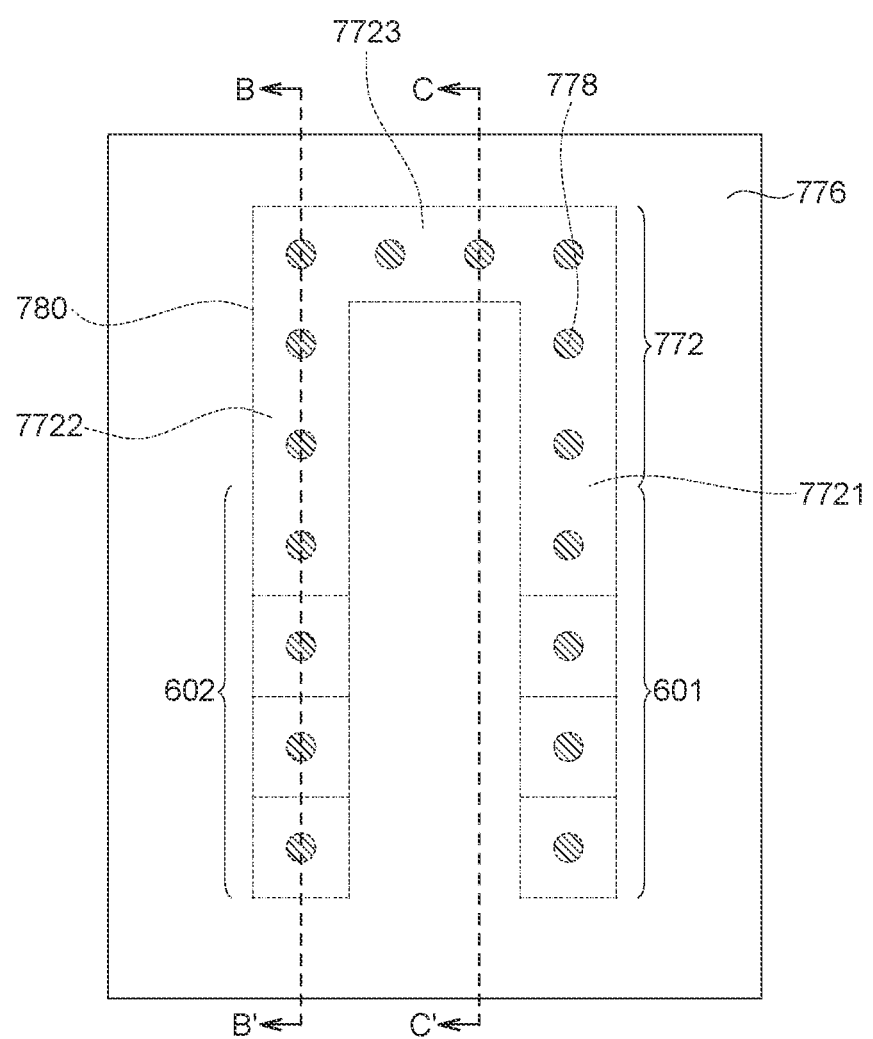
Figure 16B:
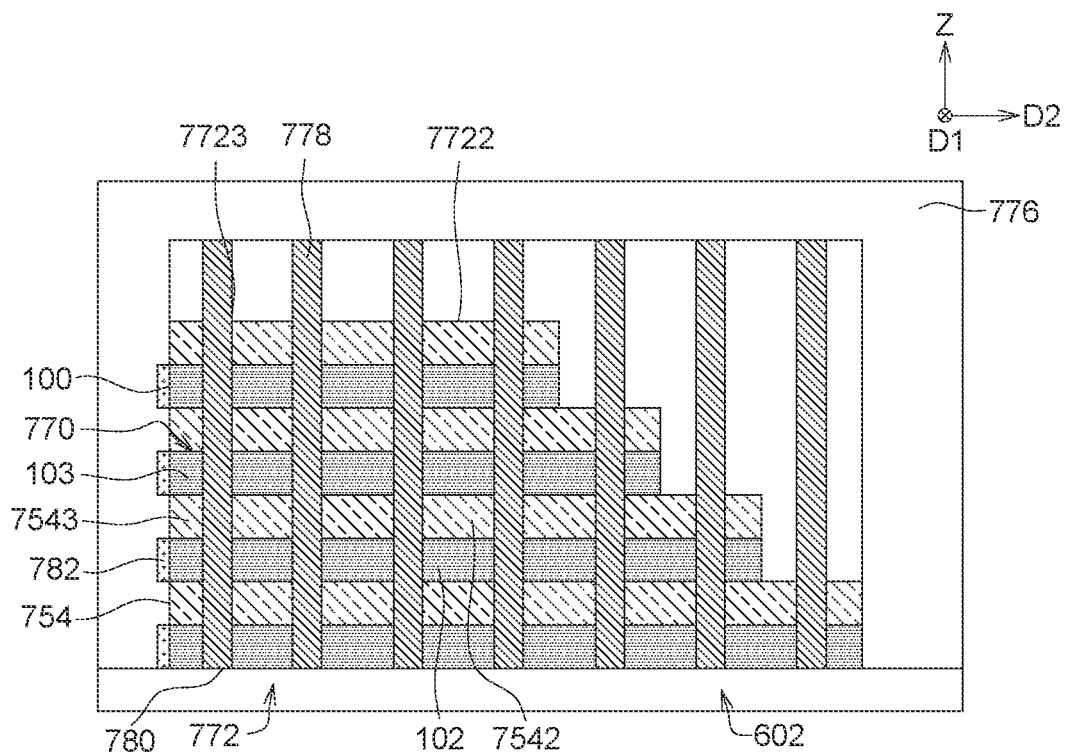
Figure 16C:
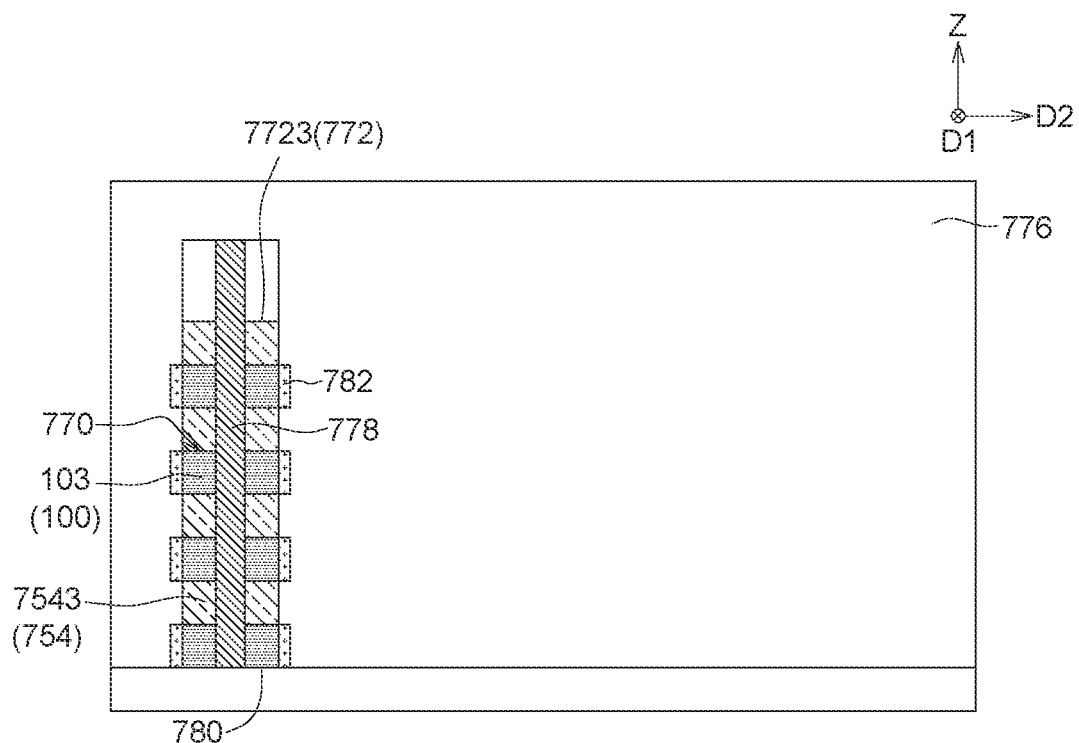

FIG. 16A to FIG. 16C are referred to. FIG. 16A is a top view of a semiconductor structure. FIG. 16B is a cross-section view of the semiconductor structure along a BB' line in FIG. 16A. FIG. 16C is a cross-section view of the semiconductor structure along a CC' line in FIG. 16A. The conductive layer 100 is formed on a surface of the semiconductor structure. An etching back step may be performed to the conductive layer 100, which remains the conductive layers 100 in the slits 770. The stacked structure 772, the first stair structure 601 and the second stair structure 602 comprise the conductive layers 100 and the insulating layers 754 stacked alternately. The conductive layers 100 are separated from each other by the insulating layers 754.

The stacked trunk part 7723 is between the first stacked branch part 7721 and the second stacked branch part 7722. The stacked trunk part 7723 may be extended along the first horizontal direction D1. The first stacked branch part 7721 and the second stacked branch part 7722 may be extended along the second horizontal direction D2. The stacked trunk part 7723 comprises the insulating trunk parts 7543 of the insulating layers 754 and the conductive trunk parts 103 of the conductive layers 100 of the stacked structure 772. The insulating trunk parts 7543 and the conductive trunk parts 103 overlap in the vertical direction Z. The second stacked branch part 7722 comprises the second insulating branch parts 7542 of the insulating layers 754 and the second conductive branch parts 102 of the conductive layers 100 of the second stair structure 602 and the stacked structure 772. The second insulating branch parts 7542 and the second conductive branch parts 102 overlap in the vertical direction Z. The structure of the first stacked branch part 7721 may be deduced by analogy. For example, the first stacked branch part 7721 comprises the first stair structure 601 and the stacked structure 772, and first insulating branch parts of the insulating layers 754 and the first conductive branch parts of the conductive layers 100 overlap in the vertical direction Z. Barrier layers 782 may be formed on sidewall surfaces of the conductive layers 100. The barrier layers 782 may comprise cobalt (Co), TaN, TiN or other suitable materials. The insulating pillars 778 pass through the U shape structure 780. The dielectric film 776 may be formed on the U shape structure 780 and the insulating pillars 778.

Figure 17A:
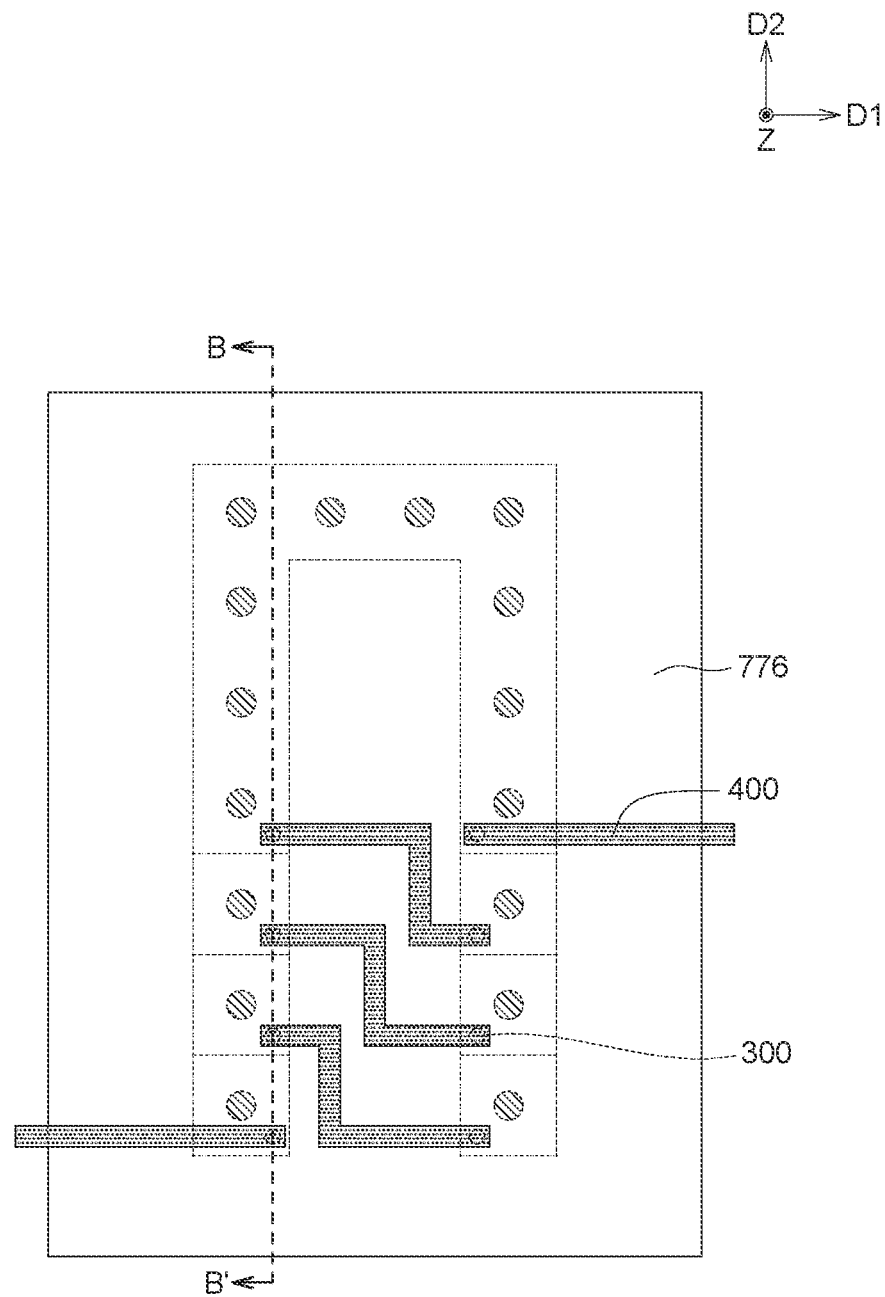
Figure 17B:
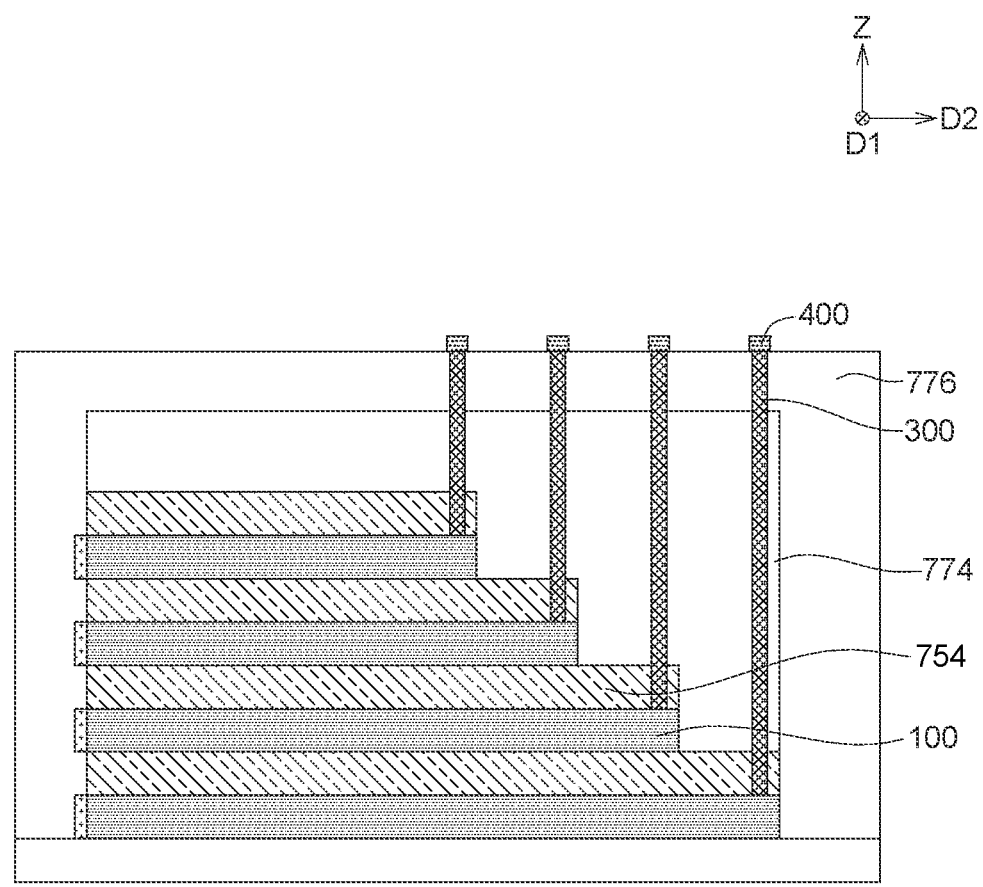

FIG. 17A and FIG. 17B are referred to. FIG. 17A is a top view of an inductor structure. FIG. 17B is a cross-section view of the inductor structure along a BB' line in FIG. 17A. The conductive pillars 300 passing through the dielectric film 776 and the dielectric film 774 are formed. The conductive pillars 300 are coupled on the conductive layers 100. The conductive wires 400 are formed on the dielectric film 776. The conductive wires 400 are coupled on the conductive pillars 300. The inductor structure comprises the coil inductor as shown in FIG. 2.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An inductor structure, comprising:
   conductive layers overlapping in a vertical direction;
   conductive elements each coupled between two conductive layers of the conductive layers,
   wherein each of the conductive elements comprises:
   a first conductive pillar coupled on an upper conductive surface of one of the two conductive layers;
   a second conductive pillar coupled on an upper conductive surface of the other of the two conductive layers; and
   a conductive wire coupled between the first conductive pillar and the second conductive pillar,
   wherein the upper conductive surfaces of the conductive layers are level with each other, and the first conductive pillars and the second conductive pillars have the same height.

2. The inductor structure according to claim 1, wherein each of the conductive layers has a U shape.

3. The inductor structure according to claim 1, further comprising insulating layers, wherein the conductive layers are separated from each other by the insulating layers.

4. The inductor structure according to claim 3, wherein the insulating layers have a U shape.

5. The inductor structure according to claim 1, comprising a coil inductor, wherein the coil inductor comprises the conductive layers and the conductive elements.

6. The inductor structure according to claim 1, further comprising insulating pillars passing through the conductive layers.

7. The inductor structure according to claim 1, wherein the conductive wires of the conductive elements extend along a first horizontal direction and overlap with each other in a second horizontal direction perpendicular to the first horizontal direction.

8. The inductor structure according to claim 1, wherein the conductive elements are arranged along a horizontal direction.

9. The inductor structure according to claim 1, wherein each of the conductive layers comprises:
   a first conductive branch part;
   a second conductive branch part; and
   a conductive trunk part coupled between the first conductive branch par and the second conductive branch part.

10. The inductor structure according to claim 9, wherein one conductive element of the conductive elements is coupled between the first conductive branch part of one of the two conductive layers and the second conductive branch part of the other of the two conductive layers.

11. The inductor structure according to claim 9, wherein the second conductive branch part of one of the two conductive layers and the first conductive branch part of the other of the two conductive layers are coupled to a first signal terminal and a second signal terminal respectively,
   the first signal terminal is one of a current input terminal and a current output terminal,
   the second signal terminal is the other of the current input terminal and the current output terminal.

12. The inductor structure according to claim 9, wherein the first conductive branch parts and the second conductive branch parts overlap with each other in a horizontal direction;
   the conductive trunk parts overlap with each other in the vertical direction.

13. The inductor structure according to claim 9, wherein the first conductive branch parts overlap with each other in the vertical direction;
   the second conductive branch parts overlap with each other in the vertical direction;
   the conductive trunk parts overlap with each other in the vertical direction.

14. The inductor structure according to claim 13, comprising:
   a first stair structure comprising the first conductive branch parts; and
   a second stair structure comprising the second conductive branch parts.

15. The inductor structure according to claim 9, wherein the first conductive branch parts are adjacent to each other, the second conductive branch parts are adjacent to each other, the conductive trunk parts are adjacent to each other.

* * * * *